(12) United States Patent
Trout

(10) Patent No.: US 11,836,128 B1
(45) Date of Patent: Dec. 5, 2023

(54) SELF-ADDRESSING MEMORY

(71) Applicant: SADRAM, Inc., Hamilton (NZ)

(72) Inventor: Harold Robert G. Trout, Hamilton (NZ)

(73) Assignee: SADRAM, INC., Hamilton (NZ)

( * ) Notice: Subject to any disclaimer, the term of this patent is extended or adjusted under 35 U.S.C. 154(b) by 0 days.

(21) Appl. No.: 18/225,046

(22) Filed: Jul. 21, 2023

(51) Int. Cl.
    *G06F 16/00*      (2019.01)
    *G06F 16/22*      (2019.01)
    *G06F 16/215*      (2019.01)
    *G06F 16/2455*      (2019.01)

(52) U.S. Cl.
    CPC ........ *G06F 16/2272* (2019.01); *G06F 16/215* (2019.01); *G06F 16/24552* (2019.01)

(58) Field of Classification Search
    USPC ........................................................ 707/696
    See application file for complete search history.

(56) References Cited

U.S. PATENT DOCUMENTS

| | | | |
|---|---|---|---|
| 6,301,394 B1 | 10/2001 | Trout | |
| 7,900,120 B2 * | 3/2011 | Pawlowski | G06F 11/1044 714/764 |
| 9,658,977 B2 | 5/2017 | Trout et al. | |
| 10,705,762 B2 | 7/2020 | Trout | |
| 10,990,551 B2 | 4/2021 | Trout et al. | |
| 11,281,585 B2 | 3/2022 | Trout | |
| 11,281,589 B2 | 3/2022 | Trout | |
| 2015/0143003 A1 | 5/2015 | Trout et al. | |
| 2017/0249274 A1 | 8/2017 | Trout et al. | |
| 2018/0276151 A1* | 9/2018 | Lea | G11C 7/1006 |
| 2020/0073809 A1 | 3/2020 | Trout | |
| 2020/0073811 A1 | 3/2020 | Trout | |
| 2021/0200706 A1 | 7/2021 | Trout et al. | |
| 2021/0365188 A1 | 11/2021 | Trout et al. | |
| 2021/0365204 A1 | 11/2021 | Trout et al. | |
| 2021/0365205 A1 | 11/2021 | Trout et al. | |
| 2021/0365360 A1 | 11/2021 | Trout et al. | |
| 2021/0365363 A1 | 11/2021 | Trout et al. | |
| 2021/0365383 A1 | 11/2021 | Trout et al. | |
| 2022/0171709 A1 | 6/2022 | Trout | |
| 2022/0171711 A1 | 6/2022 | Trout | |

* cited by examiner

*Primary Examiner* — Bai D Vu
(74) *Attorney, Agent, or Firm* — James A. Sheridan; Sheridan Law, LLC

(57) ABSTRACT

Dynamic Random Access Memory (DRAM) and a logic layer having direct access to the DRAM which provides symbolic addressing services. These services are provided by sequencers in the logic layer. The sequencers maintain a DRAM row or row-pair in sorted order, find a location and insert a new data element into the row or row-pair, all while preserving the sorted order. The sequencer is a plurality sequencer groups, each a plurality of sequencer cells. The sequencer cells perform a highly parallel pipeline insertion of a new data element. The logic layer also defines a Self-Addressing Memory Central Processing Unit (SamPU) operatively coupled to, and configured to control, the sequencer. The logic layer provides program memory for SamPU and a memory cache to build an index database. The database is subject to mitosis to accommodate the overflow of any item in the index database.

21 Claims, 9 Drawing Sheets

| 15 | 14 | 13 | 12 | 11 | 10 | 9 | 8 | 7 | 6 | 5 | 4 | 3 | 2 | 1 | 0 | OPNAME | MEANING |
|---|---|---|---|---|---|---|---|---|---|---|---|---|---|---|---|---|---|
| address/reg field | | | | | | | | reg/variant | | | action field | | | | | | |
| g10 | g9 | g8 | g7 | g6 | g5 | g4 | g3 | g2 | g1 | g0 | 0 | 0 | 0 | 0 | 0 | OP_CALL | push {ovly#, bugLevel, pc}, goto {g10:g0} |
| a7 | a6 | a5 | a4 | a3 | a2 | a1 | a0 | \$breg | | | 0 | 0 | 0 | 0 | 0 | OP_READ | \$breg <= currentRow[a7:a0] |
| address within row | | | | | | | | \$breg | | | 0 | 1 | 1 | 0 | 0 | OP_WRYT | currentRow[a7:a0] <= \$breg |
| Reserved for multi-key support | | | | | | rowtype | | \$breg | | | 1 | 0 | 1 | 1 | 0 | OP_SCAN | Scan for \$breg, rowType: o=page, 1=indx, 2=total |
| | | | | | | | | \$breg | | | 1 | 1 | 1 | 1 | 0 | OP_SCIN | Scan & insert \$breg, rowType: o=page, 1=indx, 2=total |
| \$breg | | | f4 | f3 | f2 | f1 | f0 | \$breg | | | 0 | 1 | 0 | 0 | 0 | OP_RDF | Read field {f4:f0}; \$breg <= [\$areg].field |
| | | | field number | | | | | \$breg | | | 1 | 0 | 1 | 0 | 0 | OP_WRF | Write field {4:f0}; (\$areg).field <= \$breg |
| fnc | | | nu=0 | l2 | l1 | l0 | 0 | 0 | 0 | 0 | 1 | 1 | 1 | 0 | 0 | OP_BUG | {fnc == 4} bugLevel <= {l2:l0}, (fnc != 4) ad-hoc cmds |
| m7 | m6 | m5 | m4 | m3 | m2 | m1 | m0 | variant | | | 1 | 1 | 1 | 0 | 0 | OP_PRINT | msgnum={m7:m0}; variant: 1=print, 2=expect, 3=actual |
| fnc = 0 | | | | | | | | 0 | 0 | 0 | 0 | 0 | 0 | 0 | 1 | OP_STOP | \$stop simulation |
| a7 | a6 | a5 | a4 | a3 | a2 | a1 | a0 | c4 | c3 | c2 | c1 | c0 | condition | | 1 | OP_GO_T | if(condition & status)==condition goto pc+reladr+1 |
| relative destination address | | | | | | | | | | | | | | | 1 | OP_GO_F | if(condition & status)!=condition goto pc+reladr+1 |
| \$areg | | | | | | | | \$areg | | | 0 | 0 | 0 | 0 | 0 | OP_ARITH | \$breg <= \$breg <subOp> \$breg or unary ops |
| i7 | i6 | i5 | i4 | i3 | i2 | i1 | i0 | \$breg | | | 0 | 0 | 0 | 0 | 0 | OP_RI | \$breg <= {i7:i0} zero filled on the left |
| 0 | 0 | 0 | 0 | 0 | 0 | 0 | 0 | 0 | 0 | 0 | 0 | 1 | 0 | 0 | 0 | OP_RET | Return from call; pop{ovly, bugLevel, pc} |
| 0 | 0 | 0 | 0 | 0 | 0 | 0 | 0 | 0 | 1 | 0 | 1 | 1 | 1 | 0 | 0 | OP_CFG_G | CFG(group); group.konfig <=draml |
| 0 | 0 | 0 | 0 | 0 | 0 | 0 | 0 | 1 | 0 | 1 | 0 | 1 | 1 | 0 | 0 | OP_CFG_C | CFG(cell; cell.konfig <=draml |
| R | A | - | | | | | | \$breg | | | 0 | 1 | 1 | 0 | 0 | OP_REPREG | repeat next op, \$breg = #repetitions |
| | | repeat count - 1 | | | | | | | | | 1 | 0 | 0 | 0 | 0 | OP_REPEAT | repeat next op; R=reg++/--, A=adr++/--, - = direction |
| a10 | a9 | a8 | a7 | a6 | a5 | a4 | a3 | a2 | a1 | a0 | 1 | 1 | 1 | 1 | 0 | OP_CROWI | currentRow <= {a10:a0} |
| \$areg | | | | | | | | 0 | 0 | 0 | 1 | 1 | 1 | 0 | 0 | OP_CROW | CURRENT <= \$areg |
| o7 | o6 | o5 | o4 | o3 | o2 | o1 | o0 | 0 | 0 | 0 | 1 | 1 | 1 | 0 | 0 | OP_GOVLY | Load overlay {o7:o0} & goto 16 bit adr in next opcode. |
| | | | | | | | | 0 | 0 | 0 | 1 | 1 | 1 | 0 | 0 | OP_COVLY | Load overlay {o7:o0} & goto 16 bit adr in next opcode. |
| i13 | i12 | i11 | i10 | i9 | i8 | i7 | i6 | i5 | i4 | i3 | i2 | i1 | i0 | 1 | 1 | OP_LDI | \$reg0 <= (\$reg0 << 14) + (i13:i0), no zero fill |

FIG. 5

SELF-ADDRESSING MEMORY

TECHNICAL FIELD

This specification generally relates to computer memory and, more specifically to memory addressing and particularly to self-addressing memory (e.g., self-addressing dynamic random-access memory (SADRAM).

BACKGROUND

Generally, in computing, main memory is a device or system that is used to store information for immediate use by a central processing unit (CPU) or other computer hardware. Main memory operates at a high speed compared to higher capacity but slower/less expensive bulk storage (such as disk drives). Typically, memory was separate from the CPU. Memory is used to store active programs, to store data used by those programs, as cache to improve the read and write performance of external devices, and occasionally for entire in-RAM databases where speed is critical.

Physical structure of memory: memory is typically implemented in a semiconductor media where data is stored in memory cells built from metal oxide semiconductor (MOS) transistors and other components on an integrated circuit. Memory may be non-volatile, wherein the memory retains its data when the computer is powered off, or volatile, wherein the memory loses its data when the computer is powered off. Non-volatile memories include flash memory, read-only memory (ROM), programmable read-only memory (PROM), erasable programmable read-only memory (EPROM), and electrically erasable programmable read-only memory (EEPROM). Volatile memories include dynamic random-access memory (DRAM) and static random-access memory (SRAM). DRAM is used for main memory, where capacity is important and SRAM is used as super high-speed caches and buffers, which are often built into the CPU.

SUMMARY

This Summary is provided to introduce a selection of concepts in a simplified form that are further described below in the Detailed Description. This Summary is not intended to identify key aspects or essential aspects of the claimed subject matter. Moreover, this Summary is not intended for use as an aid in determining the scope of the claimed subject matter.

In an embodiment, there is provided Self-Addressing Dynamic Random Access Memory (SADRAM), which includes Dynamic Random Access Memory (DRAM) and a logic layer having direct access to the DRAM. The logic layer defines a sequencer maintains a DRAM row or DRAM row-pair in sorted order, finds a location within the DRAM row or DRAM row-pair for a new data set element, and inserts the new data set element into the DRAM row or DRAM row-pair, while preserving the sorted order.

The sequencer may be made up of a plurality of sequencer cells. Each sequencer cell may be operatively connected to a portion of the DRAM row or DRAM row-pair and operatively connected to a portion of an input target bus. Each sequencer cell may include a data register and one or more logic circuits. The logic circuit(s) may compare data of a target byte against data of a byte in the DRAM. The logic circuit(s) may the determine, based on the resulting comparison of the data of the target byte against the byte in the DRAM, whether to store the data of the target byte in the data register, store the data of the byte in the DRAM in the data register, shift the data register to an adjacent sequencer cell, or write the data register to the DRAM.

The sequencer may be a plurality sequencer groups, each sequencer group may be made up of one of the plurality of sequencer cells. Each sequencer group may manage a data word comprising a plurality of the target bytes or a plurality of the bytes in the DRAM, each byte of the data word assigned to one sequencer cell, and each sequencer group may control the determination based on the aforementioned resulting comparison of the data of the target byte against the byte in the DRAM.

The sequencer may be a sequencer array made up of the plurality of sequencer groups. The sequencer array may manage one or more DRAM rows, and issue operating instructions to each sequencer group. Each sequencer group may interpret the operating instructions from the sequencer array to and/or for the sequencer group sequencer cells.

Further, the logic circuits may determine to take no action, in response to a determination that the data of the target byte is less than the byte in the DRAM, may determine to write the data register to the DRAM, in response to a determination that the data of the target byte is greater than the register data, and may determine to shift the data register to an adjacent sequencer cell, in response to a determination that the data of the target byte is equal to the register data.

The logic layer may define a Self-Addressing Memory Central Processing Unit (SamPU) operatively coupled to the sequencer and configured to control the sequencer array. The SamPU may also load an overlay in response to a go overlay operational code containing an overlay number of the invoked overlay and an address within the overlay and transfer control of the sequencer to the address within the overlay.

Also, the logic layer may further define a memory cache, and the sequencer may implement symbolic addresses with reference to an index database created in the memory cache. The sequencer may mitose the index database in response to overflow of the index database by switching one row of each row-pair with empty rows to create two half full row-pairs using pointer shifting. To wit, the sequencer may hold a pipeline move one or more clock cycles to avoid an index database structure smearing across a midpoint of a row of the row-pair or the row-pair. Holding the pipeline move one or more clock cycles may migrate an index database structure from a lower half full row to an upper half full row. Alternatively, or additionally, the sequencer may mitose the index database in response to overflow of the index database by assigning an original row and writing half of this row to a new empty row, creating two half-filled rows. To wit, the sequencer may hold a pipeline move one or more clock cycles to avoid an index database structure smearing across a midpoint between the original row and the new row. Holding the pipeline move one or more clock cycles migrates an index database structure from the new row to the original row. Further still, the sequencer may flush the index database to the DRAM in response to the index database becoming filled, clear the memory cache, re-sort the indexbase in the memory cache, and merge the indexbase. The sequencer my further still maintain the index database as it is generated, maintaining and preserving the sorted order prior to garbage-collection, and perform data compaction using a move operation.

The logic layer may map DRAM data set elements in the logic layer, such as by treating each data set element record number as a key field and retrieving data set elements by record numbers.

The sequencer may also support a plurality of index databases to support an in-RAM database with multiple indexes.

Other embodiments are also disclosed.

Additional objects, advantages and novel features of the technology will be set forth in part in the description which follows, and in part will become more apparent to those skilled in the art upon examination of the following, or may be learned from practice of the technology.

BRIEF DESCRIPTION OF THE DRAWINGS

Non-limiting and non-exhaustive embodiments of the present invention, including the preferred embodiment, are described with reference to the following figures, wherein like reference numerals refer to like parts throughout the various views unless otherwise specified. Illustrative embodiments of the invention are illustrated in the drawings, in which:

FIG. 5 is an operational code listing, in table format, for a self-addressing memory processing unit (SamPU), according to some embodiments.

DETAILED DESCRIPTION

Figure 1:
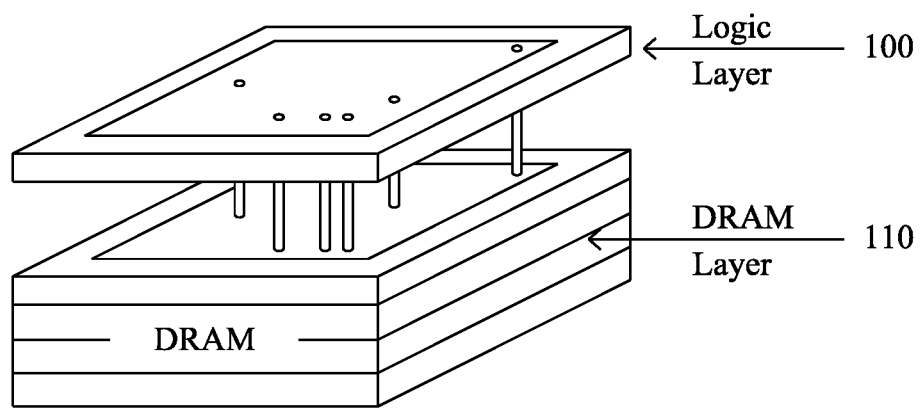
FIG. 1 is a diagrammatic illustration of a logic layer closely bound with a memory array.

Embodiments are described more fully below in sufficient detail to enable those skilled in the art to practice the system and method. However, embodiments may be implemented in many different forms and should not be construed as being limited to the embodiments set forth herein. The following detailed description is, therefore, not to be taken in a limiting sense.

Unless stated otherwise, terms such as "first" and "second," "left" and "right," "next," "above" and "below," "upper" and "lower," etc. are used herein to arbitrarily distinguish between the elements such terms describe. Thus, these terms are not necessarily intended to indicate temporal or other prioritization of such elements.

Description of Computer Memory for Purposes of this Disclosure

Memory architecture: Memory comprises an array of individual cells, each cell storing a single bit. These cells are grouped into words of fixed size, typically 8, 16, 32, 64, or 128 bits. The words are aggregated into rows comprising a predefined number of words. The number of words per row is a power of two. A row may store in excess of 64 words per row. The memory array comprises multiple rows. The number of rows is not required to be a power of two.

Row buffers: Memory technologies are referred to as "block devices," because the smallest addressable unit is a block (or row). An entire row is accessed to process a single word within that row. Reading a memory involves copying the row into a "row buffer" and then extracting individual words from the row buffer. Writing to a memory involves writing a word to the row buffer and then writing the entire buffer to the array.

Memory addressing: Any word in the array is addressed by using the upper bits of the address to select the row within the array, and using the lower bits to select the word within the row. The addresses (0,1,2,3 . . . ) are dense within the address range of a specific device, meaning that every address maps to a unique word and there are no holes.

Symbolic addressing: Embodiments of the present self-addressing memory employ a technique to add a symbolic addressing mode to the traditional direct addressing mode. Symbolic addresses provide access to memory using a symbolic address, rather than a direct address (0,1,2,3 . . . ). Symbolic addresses are not unique, not dense, not mathematically predictable, not a mere linear rearrangement of virtual addresses, and do not map directly to a particular row or word within a row.

Management of symbolic addresses: Memory access using symbolic addresses calls for mapping from said symbolic address to a direct address. Embodiments of the present self-addressing memory incorporate an algorithm to support this mapping within the memory itself (i.e., without computer system central processing unit (CPU) intervention). Such technology may be referred to as "processing-in-memory" referred to herein as "PIM." That is, embodiments of the present self-addressing memory may employ dedicated hardware (sequencers) and a small CPU (SamPU) realized in a logic layer closely bound with the memory array, as discussed in greater detail below, to perform such PIM, as also discussed in greater detail below.

Overflow: The addition of a new entry into a block of symbolic addresses may threaten to overflow a block. Such a threat is delt with in embodiments of the present self-addressing memory by allocation of additional resources (i.e., a new row) and moving some part of the original row to the new row. Embodiments of the present self-addressing memory use a technique referred to herein as "mitosis," which involves no data movement but modifies internal block management fields to achieve the same end, more efficiently, such as described in greater detail below.

Strings: Strings comprise a sequence of characters and are of unpredictable length. They map poorly onto a fixed sized row or fixed size CPU hardware. A common technique for handling strings is to add new strings to the end of a large string pool and then "garbage-collect" the pool when it becomes full. Garbage-collection removes unreferenced items in the pool and compacts the validly referenced items within the pool, thus freeing up contiguous space at the end of the pool for new strings. Strings are complex, in that the string pool may contain substrings, in which one string is a substring of another.

Sort: Sort is a widely used algorithm consuming between twenty-five and fifty percent of all computing resources.

Sort can be applied to all manner of computer objects, but the most common type of sort is performed upon a specific key field(s) within a data record. The purpose of sort is to arrange the original objects (records) in order based upon these keys. There are many sort techniques, however, they admit of classification into three broad areas: record sort, radix sort, and key sort. Record sort involves moving original data records into a sorted order. The sorted data can then be accessed in linear order (i.e., directly addressed). Typical record sort is necessarily limited to a single sort key (since the resulting array cannot be in two sort orders simultaneously). Radix sort is a variant of record sort, in which data is progressively sorted on a small part of a key and the succeeding sorts refine the order but do not alter the order established by earlier sorts. The original IBM card sorters used this technique. Key sort involves creating a separate structure of references to the original data. The references are sorted but the original data is not moved. Key sorts can support multiple simultaneous keys into the original data but at the expense of additional overhead in accessing the sorted data (a given record in the sorted array typically cannot be accessed directly but requires access to the key structure followed by second access to the record referenced by the key; this mode of access is referred to as "indirect"). The most elementary sort technique is referred to as "bubble sort" which compares every element of the original data set with every other element. This is an extremely expensive O(N2) process. More sophisticated sorts use bubble sort, or the like, for very limited subsets of the data and then merge the results. The merge process is an O(N) process and composite performance of a sort-merge is O(N*log 2N). Hashing techniques and other strategies to divide the data into smaller sets for the original sort can be used to improve overall performance.

Sorted order: is a valuable feature of any array of data. For example, the lowest level data array in Structured Query Language (SQL) is often a sorted array. This has two advantages: first a smaller number of objects need to be managed since the lowest level object is now an array rather than a single record; and secondly sorted arrays can be searched very efficiently using techniques like 'binary chop'. Binary chop depends upon the underlying array being sorted and narrows the location of a record by a factor of two with each iteration. Keeping data in 'sorted order' is a common software technique.

Database: Databases each comprise a block of user data and zero or more indexes (i.e., sorted keys) into that data. Databases systems typically provide many additional support functions which are not described or used herein, in embodiments of the present self-addressing memory. One important type of database is the so-called "in-ram-database," in which (a) major part(s), or even the entire database is kept in main memory. The reason for this computational expensive solution is speed of access.

Variable length record: Variable length records are blocks of data in which the size of individual fields and/or the size of the overall record is not fixed. For example, a name field in a demographic data base must be able to represent fields containing "John" or "Tom" as well as "Bartholomew." Variable length fields/records do not map cleanly to computer architecture. Because they are so difficult to implement, they are rarely used. Instead, data records are engorged to accommodate the largest fields. This wastes significant amounts of memory and secondary storage (e.g., such as up to fifty percent). Thus, storing a database is stored entirely in memory results in computationally expensive overhead.

Pipeline processing: Pipeline processing is a technique wherein objects are moved along a vector of stations each one of which performs a small part of the computations. Such techniques are used for extremely high-speed CPUs. An example of pipelining is the "pipeline move" in which no actual computation is done at each station, but the data is moved from one station to another. Pipelining is useful because the individual object need only be moved from one station to their immediate neighbor. Because each station in a pipeline process can operate simultaneously pipeline processes yield dramatic advantages in speed.

Memory is a significant, if not the principal, constraint on computer system performance. This fact is not lost on CPU manufacturers who have integrated high speed cache memory into the CPU. Generally speaking, this results in exponential improvements to performance, especially when a problem fits entirely into the cache memory. However, problems that are larger than the cache require a different strategy; such strategies include minimizing memory traffic and/or having the memory perform some part of the computation (PIM) independent of the CPU. PIM (having the memory performing some part of the computation), has been a goal of many development efforts. However, memory transistors have been optimized for storage, not switching. Thus, memory transistors are not well suited for performing such calculations and PIM efforts have been largely nugatory.

However, modern chip packaging techniques such as Through-Silicon Vias (TSVs) enable a logic layer to be closely bound with the memory array and is ideal for performing these computations. FIG. 1 is a diagrammatic illustration of logic layer 100 closely bound with memory array 110. The logic layer has direct access to the underlying DRAM (and row buffer), intimate knowledge of the location and time-to-access DRAM, and can perform its share of the computations without CPU involvement. Since the computations are done in the logic layer and do not use the DRAM transistors these techniques are more precisely named "process-near-memory," but as noted above, are referred to herein as "PIM."

In addition to reducing the number of CPU operations required to access any datum, the logic layer/memory architecture enhances those gains by (physically) shortening the connections between DRAM and the logic layer. The technology enabling these connections is generally referred to as "thru silicon vias." Because memory-based computations are performed much closer to the data itself the total power per unit of computation should fall—a happy result that has been confirmed by manufacturers who have incorporated a logic layer into their DRAM.

Such logic layers bound to the underlying memory array makes embodiments of the present self-addressing RAM (SADRAM) possible. Embodiments of the present SADRAM architecture preform functions that can be performed close to memory, whilst not competing with the computer system CPU for the computational algorithm itself.

SADRAM Architecture

SADRAM is an architecture, which makes use of a logic layer packaged with the DRAM and uses this logic layer to perform addressing functions. These functions provide "symbolic addresses" as well as the traditional "absolute addresses." Symbolic addresses enable, in accordance with embodiments of the present self-addressing memory, a range of DRAM services over-and-above simply storing and retrieving data. Various embodiments of the present SADRAM do not perform general purpose computations.

When the SADRAM architecture is applied to technologies other than DRAM it is referred to as "self-addressing memory" ("SAM," hereinafter). The terms SAM and SADRAM will be used interchangeably herein. Regardless of the underlying technology, SAM or SADRAM perform computations at the block (i.e., row) level. Because these rows are fixed in size in SADRAM and because the core of the SADRAM architecture is implemented in hardware, these computations can be performed in parallel with corresponding improvements in speed.

Embodiments of SAM implement symbolic addresses with reference to an index database, referred to herein as an "indexbase," which is discussed further below, with respect to FIG. 6. The indexbase resides primarily in a static random-access memory (SRAM) realized in the logic layer, but may spill over to DRAM. Since the logic layer is distinct from the DRAM itself, the logic layer can provide address management, indexing, caching, and control functions, without change to the underlying (DRAM) array.

Embodiments of SAM architecture employ a "sequencer." Sequencers are realized in hardware and perform low-level comparisons and data movement. In accordance with various embodiments comprise three layers: sequencer cells, sequencer groups, and sequencer arrays. Each layer is encapsulated by the next. That is, the sequencer is made up of sequencer arrays, the sequencer arrays are made up of sequencer groups, and sequencer groups are made up of sequencer cells. All these are realized in the logic layer alongside the aforementioned SamPU which controls the ensemble of sequencer components.

Figure 2:
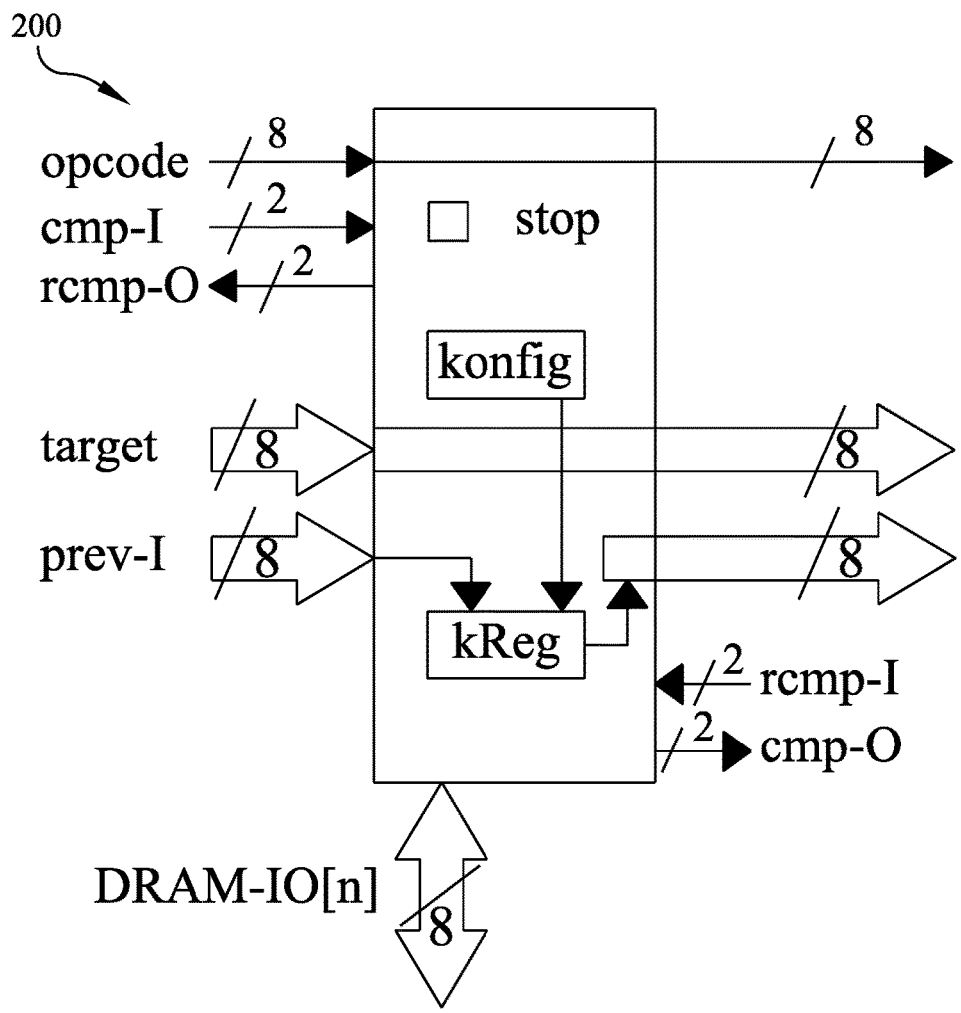
FIG. 2 is a block diagram illustrating a basic self-addressing memory sequencer cell, according to some embodiments.

The lowest level component, the sequencer cell (or "cell"), is connected directly to a portion of a DRAM row (buffer) and to a portion of the input target bus. FIG. 2 shows single sequencer cell 200. The sequencer cell is typically 8-bits wide. Each sequencer cell incorporates a data register (kReg) and logic circuits to compare a target byte data against a byte from the DRAM. Based on this comparison and signal lines sequencer-group, the sequencer cell may store the target data in kReg, store memory in kReg, shift kReg to an adjacent sequencer cell, or write kReg back to the DRAM array. Thus, in FIG. 2, sequencer cell 200 is eight bits wide. The data inputs to the sequencer cell are one byte of the target ("target"), one byte of DRAM ("DRAM-IO[n]"), operational code ("opcode") from the parent sequencer group (See FIG. 3) controlling the sequencer cell, the results (cmp-I and rcmp-I) of comparison from its neighboring sequencer cells to the "left" and "right", and the result of its internal comparison (cmp-O). That is, cmp-I pairs with cmp-O, and rcmp-I pairs with rcmp-O, in FIG. 2.

Figure 3:
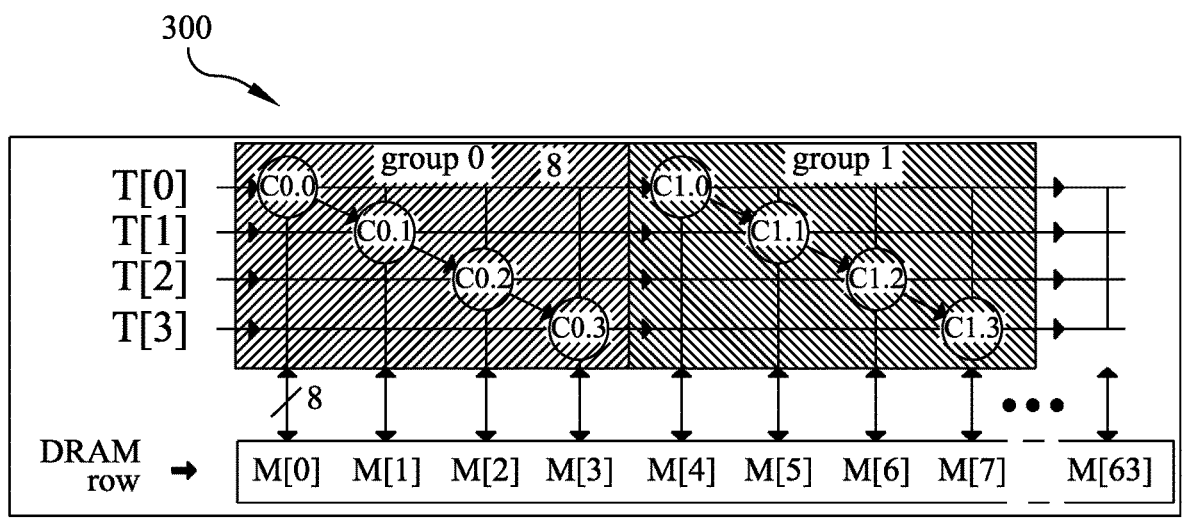
FIG. 3 is a block diagram illustrating a diagonal arrangement of self-addressing memory sequencer cells and their connections to a target bus and a memory, according to some embodiments.

As noted, sequencer cells are aggregated into sequencer groups (or "groups"). Each sequencer group handles multiple bytes constituting a word. Each byte of the word is assigned to a sequencer cell (200). The sequencer group is typically eight sequencer cells (64 bits) wide. The sequencer cells within the sequencer group are arranged on a diagonal so that each sequencer cell can "see" one byte of the target and one byte of DRAM. FIG. 3 is a block diagram illustrating a diagonal arrangement of SAM sequencer cells and their connections to a target bus and a memory, according to some embodiments. FIG. 3 shows diagonal geometry 300 of sequencer cells (C0.0 through C0.3 and C1.0 through C1.3), and their connections to the target bus (T[0] through T[3]) and the DRAM (M[0] through M[7] ( . . . M[63]). Two sequencer groups (Group 0 and Group1) of four sequencer cells (C0.0 through C0.3 and C1.0 through C1.3, respectively) are shown. The number of sequencer cells in a sequencer group (referred to herein as, the "target bus size") is a determinant of sequencer size and performance. The sequencer group controls the action of its sequencer cells and the results of the sequencer cell's target-to-DRAM comparison.

Figure 4:
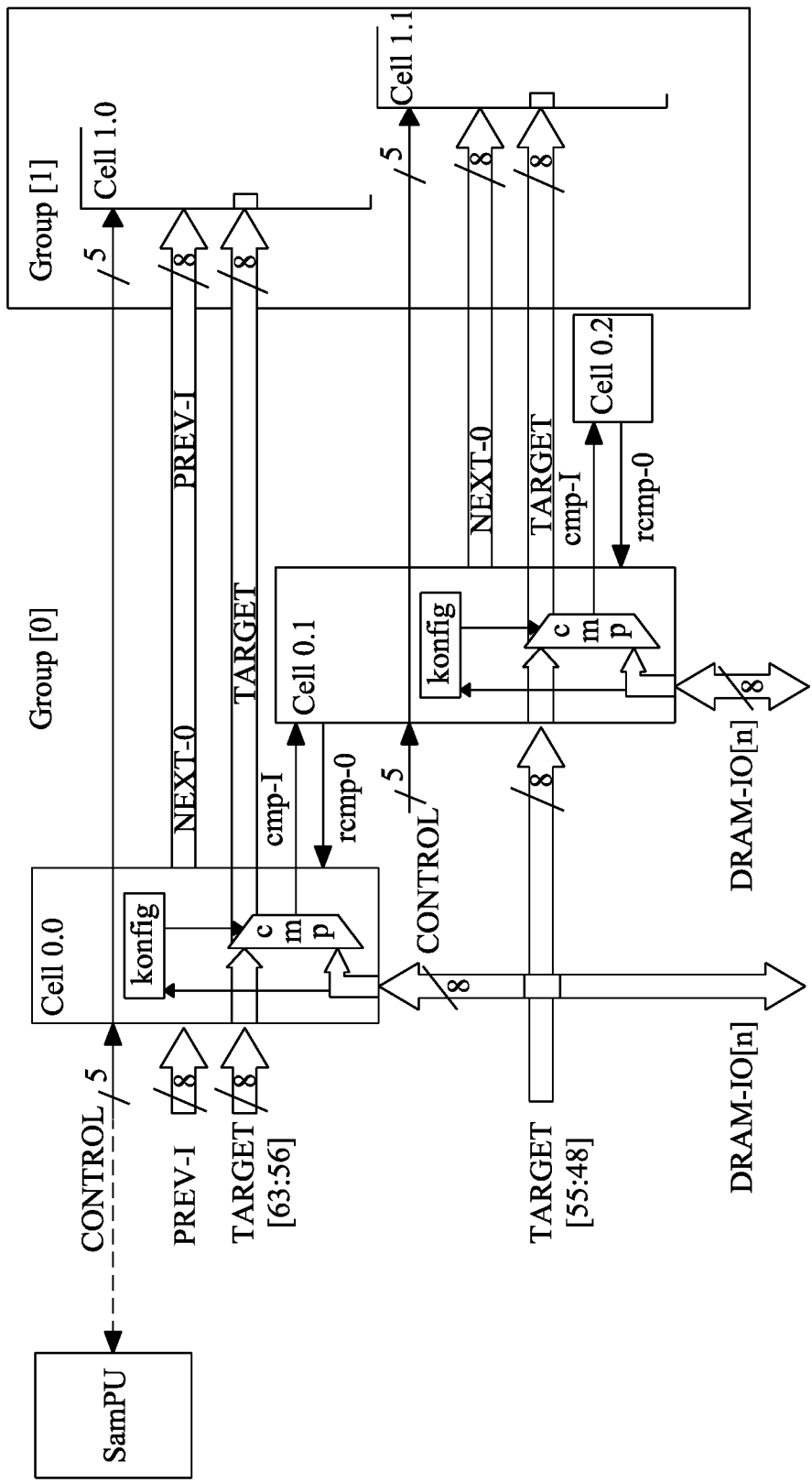
FIG. 4 is a block diagram illustrating five self-addressing memory sequencer cells, according to some embodiments.

FIG. 4 is a block diagram illustrating five self-addressing memory sequencer cells and the logical connection between multiple sequencer cells, according to some embodiments. FIG. 4 shows five sequencer cells distributed over two sequencer groups. Sequencer cells 0.0, 0.1, and 0.2 are the beginning of a diagonal sequencer group; Sequencer cells 1.0 and 1.1 are the beginning of a second diagonal sequencer group. That is, FIG. 4 shows five sequencer cells: cell0.0, cell0.1, cell 0.2, cell 1.0 and cell 1.1. Cell0.0, cell0.1, cell 0.2 on the left side of FIG. 4 belong to group0; cell 1.0 and Cell 1.1 on the "right" belong to group 1. The next-O prey-I bus connects from cell 0.0 in group 0 to cell 1.0 in group 1. Each byte of target[63:56] (the uppermost byte of the target) is broadcast to cell 0.0, cell 1.0, . . . , and target[55:48] is broadcast to cell 0.1, cell 1.1, . . .

The result of each sequencer cell's comparison is encoded on a compare-bus which is transmitted from each sequencer cell to its neighbor to the "right" (FIG. 4, cmp signals). The result of the last sequencer cell is "daisy chained" back to the first sequencer cell of the sequencer group (i.e., "from right to left") on another compare bus referred to herein as the "rcompare bus" (FIG. 4, rcmp signals). This propagates the result of the sequencer group comparison to all sequencer cells in the sequencer group. The compare signals follow the diagonal structure of the sequencer group, as can be gleaned from FIG. 2, wherein it is shown that the respective cmp and rcmp signals are at the "top left" and "bottom right" of the sequencer cell (200). In accordance with various embodiments, cmp and rcmp are each two bits wide, as shown in FIG. 2, and encode the conditions >, <, or == from the comparison.

As noted, sequencer cells within a sequencer group are physically arranged on a diagonal (see FIG. 3). Thusly, each sequencer cell has direct access to its part of the target bus (T[i] in FIG. 3) and direct access to its part of the DRAM bus (M[i] in FIG. 3). The compare and rcompare buses follow this diagonal. This enables the sequencer group to perform a full word comparison. Each sequencer group operates in parallel and transmit their comparison to the sequencer group on their "left."

As also noted, the sequencer groups (300) are aggregated into a sequencer array. FIG. 3 shows only the first two sequencer groups (group 0 and group 1) of a sequencer array which extends rightwards to fills an entire DRAM row (or multiple rows). Each sequencer group takes its operating instructions from the sequencer array and interprets those instructions for its subordinate sequencer cells. Each sequencer array manages one or more DRAM rows. The sequencer array is controlled by the aforementioned SamPU. The sequencer family maintains these rows in sorted order. They perform this function by orchestrating the compare operations of its sequencer groups and sequencer cells and by selectively invoking the shift capability of the sequencer cells when appropriate.

In accordance with embodiments of the present SAM, the SamPU is a finite state machine, which executes instructions from a program store. Both SamPU and the program store are implemented in the logic layer. In various embodiments, SamPU is a register machine with a 16-bit opcode and data width equal to the target bus size (e.g., 64 bits). The SamPU incorporates special opcodes to control the sequencers (e.g., OP_SCAN, OP_SCIN, and OP_MOVE), special opcodes to read/write fields of the indexbase (OP_RDF and OP_WRF), and special opcodes to load and use overlays (OP_GOVLY and OP_COVLY). FIG. 5 is an opcode listing, in table format, for a SamPU, according to some embodiments. These speed-critical opcodes are implemented directly in the logic layer. The SamPU's general purpose opcodes (OP_ARITH, R2R, RI, etc.) are also implemented in the logic layer but are less specialized. They are used to execute code in the program store. The tasks performed by this code are more complex but less demanding of speed.

The SamPU contains an internal stack onto which data or return words generated by call instructions are stored. The stack is accessed LIFO (last-in-first-out) order. Management of the stack is performed (entirely) by the SamPU. The stack grows upwards (i.e., increasing stack addresses) as recorded in a stack pointer register.

The program store is a combination of read only memory (ROM) and read-write memory (R/W). The ROM memory is required to provide basic services at boot-up and the R/W memory is loaded by the SamPU on request from DRAM, according to some embodiments. Both the ROM and the R/W memory are part of the same (16-bit) address space. In one example embodiment, overlays may be 16384 (0x4000) bytes complementing the ROM code of 49152(0xC000) bytes. In accordance with some embodiments, 255 separate overlays can be accommodated allowing for a maximum code space of 49152+255*16384=4,227,072 (0x408000) bytes (approximately 4Mbytes). In various embodiments the (core) SADRAM code resides exclusively in ROM and overlays reside primarily in R/W storage.

Overlays are invoked with OP_GOVLY (goto overlay) and OP_COVLY (call overlay) opcodes. OP_RET is also involved in the overlay process to the extent that it must interpret the fields of a return word created by OP_COVLY. OP_GOVLY (go overlay) may be a 32-bit opcode containing the overlay number and the address within the overlay. OP_COVLY (call overlay) is similar to OP_GOVLY, but also pushes down a return word. The return word generated by OP_COVLY contains the return address, the current overlay, and state information. SamPU automatically loads the requested overlay (if not already loaded) before transferring control to the specified address within the overlay. OP_CALL instruction is a version of the call which is local to the current overlay and relative to the current instruction. OP_CALL is a 16-bit opcode whereas OP_COVLY may be a 32-bit opcode. The OP_RET (FIG. 5) instruction automatically restores the previous overlay and resumes execution at the address stored within the return word. All four of these opcodes (OP_GOVLY, OP_COVLY, OP_CALL, and OP_RET) are implemented within SamPU. In accordance with various embodiments, the effective address space of SamPU (i.e., 4 Mbyte) enables many of the high-level functions (such as sort or string processing) and is an appropriate infrastructure for manufacturing, field testing, security packages, and user defined code.

OP_GOVLY and OP_COVLY can be used for transfers within the SamPU core, within an overlay, between the core and an overlay, and between different overlays. The address field of the OP_CALL instruction may in various embodiments be (only) 11 bits, and OP_COVLY may often be used to call outside the range of an OP_CALL. Thusly, in various implementations, overlays are loaded from DRAM and, to wit, are moved from DRAM to the overlay R/W memory. An alternative arrangement wherein the overlays are maintained in the logic layer as "shadow pages" may be used in, or within, some embodiments.

Software structures residing in the DRAM rows are arranged as an in-ram database referred to herein as the indexbase. The indexbase is built from three structures, i.e., cINDX, cPAGE, and cBOOK; these are referred to collectively as cITEMs. Each cITEM comprises a binary component (cITEM.bin) and key (cITEM.key). The binary component houses fields such as the address of subordinate structures, a counter, and various flags. To wit, FIG. 6 is a block diagram illustrating components of a SAM indexbase 600 and underlying user data, according to some embodiments. At the top of FIG. 6 is the cBOOK[ ] array with two subordinate cPAGE arrays. In the middle of FIG. 6 is the cPAGE[ ] array ("aaa," "jack," and "path"). Of the ten subordinate cINDX structures only the one beginning with "jack" is expanded in FIG. 6. The third row of FIG. 6 contains a single cINDX[ ] array comprising {"jack," "jill," "joey," "kato," "kilo," . . . "lent"} each one of which points to the underlying data which is displayed at the bottom of FIG. 6. Each cITEM is stored in an array which occupies one or more rows giving rise to terminology such as "single-row cITEM" or "multi-row cITEM." In various embodiments, multi-row can be taken to mean double-row. The terminology "cITEM[ ] array" refers to the collection of cITEMs filling the row(s). In various embodiments, cITEM[ ] arrays are maintained in sorted order and may be only partially filled.

In accordance with embodiments, cITEMs are inserted into a row using a pipeline move (i.e., each sequencer cell/group moves its content to its neighbor to the "right" in a single clock cycle). Transfer distances more than a single word are accomplished by holding the insert line active for two, three . . . clocks depending on the size of the cITEM. In one example, for a key size of eight bytes the size of cINDX is two 64-bit words, and a pipeline move is therefore active for two clock cycles. The size of cPAGE/cBOOK may be three 64-bit words under some circumstances, which results in the pipeline move being active for three clock cycles. The pipeline move may only be applicable to that part of the row in which the cITEM.key is "above" the target key. This selective shift is controlled by a mask register generated by the sequencer array and mediated by the sequencer group, according to some embodiments. Pipeline processing can also be used to move data from one row to another using the OP_MOVE opcode. OP_MOVE moves individual cITEMs from the "low" row to the "high" row, i.e., the end of the first row to the beginning of the second row. The sequencer shift line is held active for enough cycles to achieve the requested move. The move is from "left" to "right" and the order of data in the new row (the "high" row) preserves the sort order established in the "low" row.

Figure 7A:
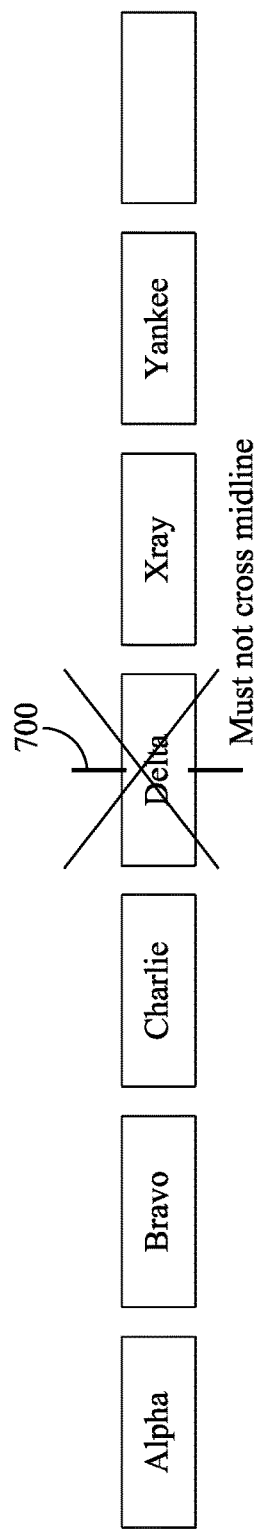
FIGS. 7A through 7C are block diagrams illustrating midcross smearing across a midpoint and solutions to midcross, according to some embodiments.

Whether the cITEM is single-row or multi-row, special care must be paid to ensure that no element of an cITEM[ ] array smears across the midpoint of the row(s). FIG. 7A is a block diagram illustrating a smearing across midpoint 700. For example, (in a single-row architecture) if the size of an cITEM is three 64-bit words(groups) and the size of the row is 32 64-bit words(groups), then cITEM[0, 1, 2, 3, and 4] (e.g., alpha, bravo and charlie, in FIG. 7A) fit within the first half of the row and cITEM[6, 7, 8, and 9] (e.g., xray and yankee, in FIG. 7A) fit within the upper half of the row. However, cITEM[5] (e.g., delta, in FIG. 7A) would smear across the midpoint (700) if it was stored contiguously following cITEM[4] (e.g., charlie, in FIG. 7A). This is referred to as "midcross" and would interfere with mitosis, as discussed below, if not properly handled.

Figure 7B:
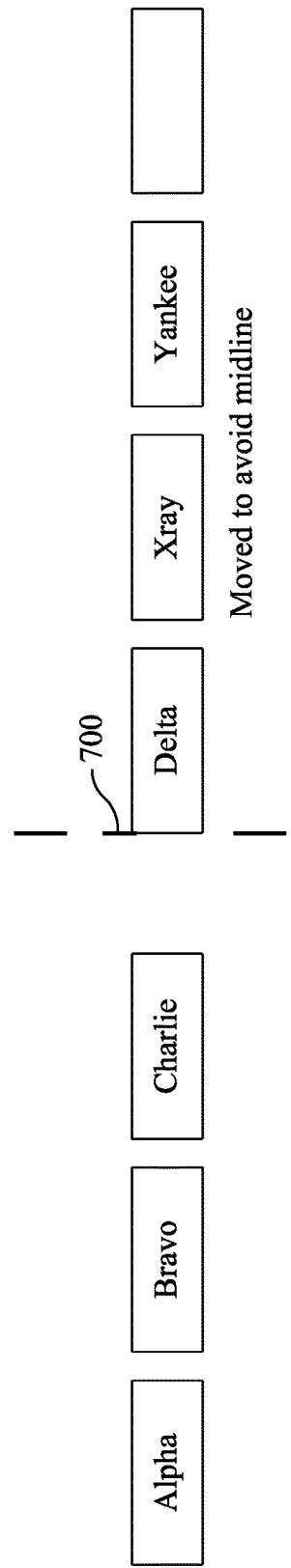

FIG. 7B is a block diagram illustrating a single move solution to midcross, according to some embodiments. Such a solution to midcross under various embodiments, is, following the above example, to store cITEM[5, 6, 7, 8, and 9] (e.g., delta, xray and yankee, in FIG. 7B) at a slightly higher location in the upper portion of the row—in this case a mere one 64-bit word higher. When an cITEM migrates from the lower half of the row to the upper half of the row that cITEM will be subject to an extra move. The pipeline move is held for additional cycle(s) and the mask register selects just the "midpoint" item (e.g., delta, in FIGS. 7A and 7B) in order to affect this extra move.

Figure 7C:
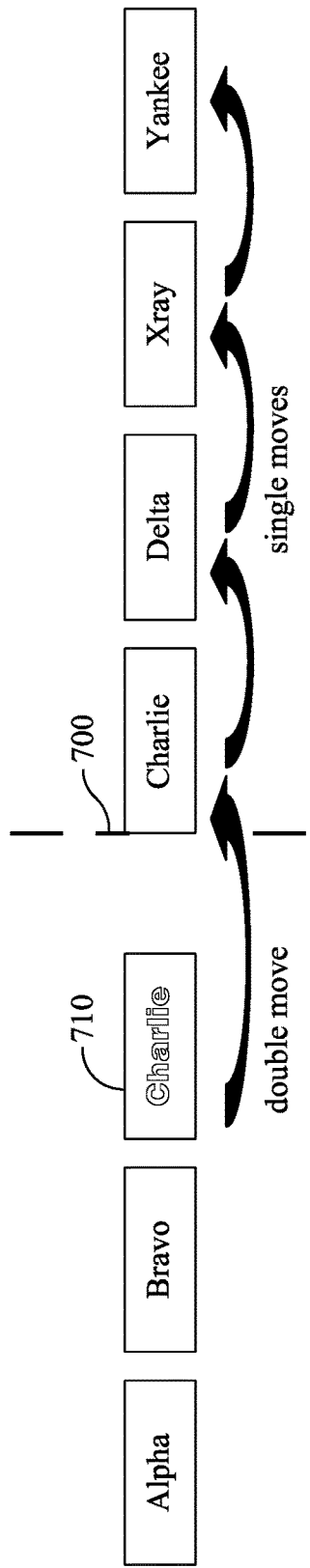

FIG. 7C is a block diagram illustrating a double move solution to midcross, according to some embodiments. Such a solution to midcross under various embodiments, is, again following the above example, to store cITEM[5, 6, 7, 8, and 9] (e.g., charlie, delta, xray and yankee, in FIG. 7C) at a highest location in the upper portion of the row. When an cITEM migrates from the lower half of the row to the upper half of the row that cITEM will be subject to an extra move. The pipeline move is held for additional cycle(s) and the mask register selects just the "midpoint" item (e.g., charlie, in FIG. 7C) in order to affect this double move to create space 710 for a new record.

The sequencer inserts cITEM entries into the DRAM row(s) under its control. Inevitably these row(s) become(s) full and a process referred to herein as "mitosis" is invoked. There are, in accordance with various embodiments, two distinct types of mitosis, single-row mitosis and multi-row mitosis, depending on whether the row involved is a single-row or multi-row architecture. Mitosis, of either type, modifies the page structure and in the process of modifying the page may provoke a secondary mitosis of the parent page. Mitosis of the parent page modifies the cBOOK parent which may thereby provoke a tertiary mitosis of the cBOOK[ ] array (see FIG. 6).

Figure 8A:
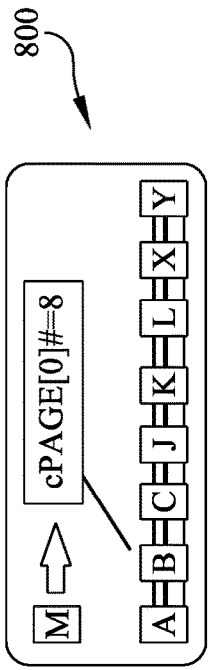
FIGS. 8A through 8C are block diagrams illustrating a process of self-addressing memory double-row mitosis, according to some embodiments.
Figure 8B:
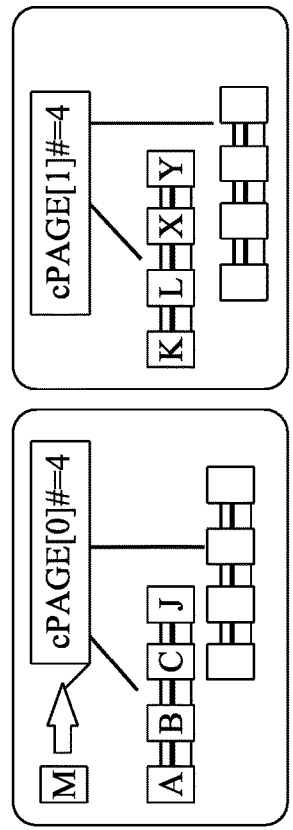
Figure 8C:
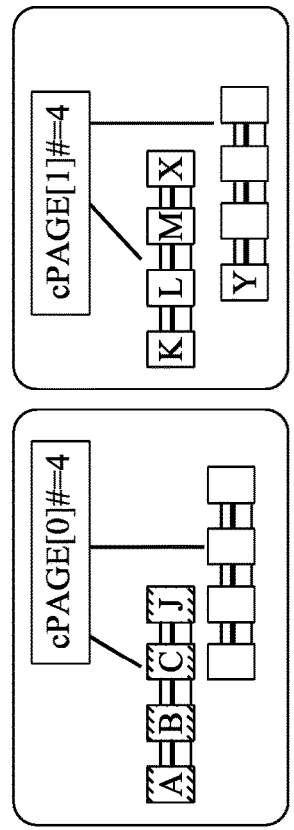

Attention is directed to FIGS. 8A through 8C, which are block diagrams illustrating a process of SAM double-row mitosis, according to some embodiments. Multi-row mitosis switches the partners of each row-pair with empty rows. Thus, two half-full row-pairs are created, and the created two half-full row-pairs are integrated into the indexbase. FIGS. 8A through 8C shows double-row mitosis. FIG. 8A shows indexbase 600 before mitosis, notable because each index row {A, B, C, J} and {K, L, X, Y} is full. The insertion of record M (upper left corner) threatens to overflow the indexbase. FIG. 8B shows indexbase 800 after mitosis. Indexbase 800' now contains two pages, page[0] and page [1]), each with half the original data and paired with empty rows. Record M is shown as still awaiting insertion. FIG. 8C shows the indexbase after record M has been inserted into page[1] of indexbase 800". Multi-row mitosis involves no data movement. It is carried out with pointer shifting.

Figure 9A:
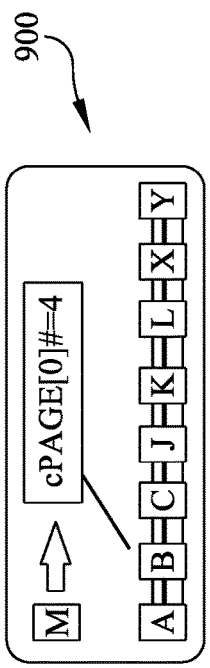
FIGS. 9A through 9C are block diagrams illustrating a process of self-addressing memory single-row mitosis, according to some embodiments.
Figure 9B:
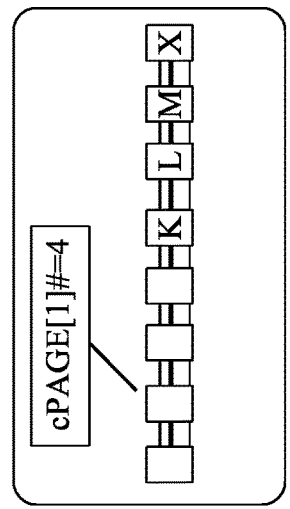
Figure 9C:
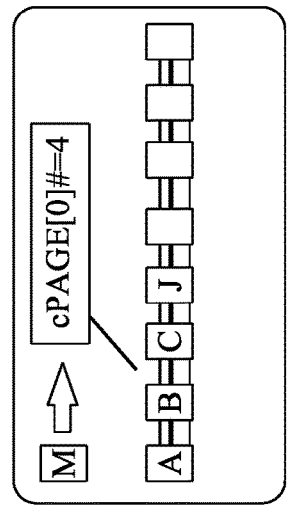

By contrast, single-row mitosis assigns a single row to each sequencer array and physically writes the upper half of this row to an empty row. Thus, a single row becomes two half-filled rows. The new page containing the "upper" part of the old row is addressed by inverting high order address bit. FIGS. 9A through 9C are block diagrams illustrating a process of SAM single-row mitosis, according to some embodiments. Therein, FIG. 9A shows indexbase 900 before mitosis, notable because each index row {A, B, C, J, K, L, X, Y} is full. The insertion of record M (upper left corner) threatens to overflow the indexbase. FIG. 9B shows the indexbase after mitosis, during which a single (additional) row is assigned to the sequencer array the upper half of the row is written to the empty row. As a result, indexbase 900' now contains two pages, page[0] and page[1]), each with half the original data. Record M is shown as still awaiting insertion. FIG. 9C shows the indexbase after record M has been inserted into page[1] of indexbase 900". Although single-row mitosis moves data from the "upper" half of the original row to the "lower" half of the new row, in contrast to multi-row mitosis, which involves no data movement, a saving in other fields within each cITEM make single-row mitosis a useful option. The left-hand side of FIG. 9B may be referred to as a "left-handed row" and the right side may be referred to as a "right-handed row." The use of his "handedness" obviates the need for data movements during single-row mitosis.

Both techniques, multi-row mitosis and single-row mitosis, may be implemented in various embodiments, and different techniques may be applied to different cITEMs. For example, cINDX and cPAGE may use the single-row organization, whereas cBOOK may use double-row organization, according to some embodiments.

The SamPU generates opcode to control the sequencer array, which in turn generates opcodes for its sequencer groups which in turn generate control signals for its sequencer cells. SamPU can completely overlap program fetch with these sequencer operations. There are any number of advantages to use of a CPU architecture (SamPU). For example, much more complex operations can be implemented using a software-based solution, than with hardware-only based solutions, and complex operations, implemented in the overlay part of the program store, can be created in the field.

SamPU is supported by a compiler, which may be run on a computer system. SamCompile translates programs written in ascii to SamPU opcodes represented in binary. The language in which these programs are written is a "register transfer language," meaning that operations and data movement are represented by $reg=expression. This language provides direct control over individual opcodes. However, SamCompile may generate multiple opcodes for high level constructs such as "if statements, for statements, while statements, do statements," large literals, parameterized function calls, and the like. SamCompile supports SamPU overlays. Overlays are declared explicitly. Overlays may be compiled separately from the main code. SamCompile generates the aforementioned OP_GOVLY/OP_COVLY as directed by a $overlay directive. Externally compiled overlays may be encrypted. The output of SamCompile is an ELF file, an industry standard executable code format. The core SamPU program and each overlay is represented as a program segment in the ELF file. When the ELF file is loaded into memory, each segment is assigned an address corresponding to its overlay number. Overlay processing by the SamPU is automatic.

SAD RAM Operation

With reference to FIG. 3, SAM indexes user-data as it is written to memory using the sequencer. SAM places a vector of sequencer cells (C0.0, C0.1, etc.) across the DRAM sense lines or row buffer. These are aggregated into sequencer groups and sequencer arrays as shown in FIG. 3. C0.0:3, C1.0:3, etc. The sequencer groups in FIG. 3 simultaneously compare a single target (T[i]) against a vector of sorted values stored in the DRAM row(M[i]). Based on this comparison, the position of the target within the sorted row is determined, and by inserting the target at this position, the row is maintained in sorted order. A sequencer performs this comparison and insertion, but the logic layer can also create new rows, mitose rows (i.e., perform mitosis on rows), move items from one row to another, and write-back a row-buffer to the DRAM.

As noted, the logic layer implements a cache, the sequencers, the SamPU, and the program store for SamPU. Multiple indexbases can be supported through a single sequencer array or with multiple sequencer arrays. Multiple sequencer arrays are particularly useful when the sequencer is used to support in-RAM databases with multiple indexes.

The user (e.g., a programmer writing for a machine incorporating the SADRAM architecture) may specify the type, location, and size of the key(index) within the user record. The type may be alphabetic, integer, or float. Within the indexbase the byte order of any key field is, most significant byte first (MSB). Alphabetic fields are in MSB order, but integers and floats are converted to MSB-order when extracted from the record.

The indexbase comprises arrays of cINDX, cPAGE, and cBOOK structures, collectively referred to as cITEMs. Each cITEM comprises some binary information followed by a key. These items are created in an SRAM cache fabricated in the logic layer. This is referred to as SAM-cache to distinguish it from CPU-cache. In some implementations, cITEM[ ]s reside entirely in SAM-cache but can be paged to DRAM, if necessary. The sizes of cINDX, cPAGE, or cBOOKs are dependent upon the size of the key and therefore unknown at design-time. Consequently, the number and location of the cITEMs is not fixed within the DRAM row.

In accordance with various embodiments, the size of the binary part of a cITEM is different between a cINDX, cPAGE, and cBOOK and the size of the key portion of a cITEM depends upon the user definition of the key. cITEMs are therefore intrinsically variable in length. For consistency, the address of a cITEM is the beginning of the key portion of the cITEM. The opcodes OP_RDF and OP_WRF (read field and write field) access the binary fields of a cITEM backwards from the address and the key field forward from the address.

The location and number of sequencer groups may be fixed at hardware design-time. However, as noted above, cITEMs are variable in size. This mismatch may affect hardware implementation of SDRAM. The mismatch may, is, in accordance with various embodiments, resolved by using configuration bits in each sequencer cell, sequencer group and array. Configuration information at the sequencer cell level is stored in a konfig register. The konfig register is loaded from a DRAM row before any other operations are performed. Through such configuration, variable sized cITEMs are mapped onto fixed sized sequencer groups.

Figure 10:
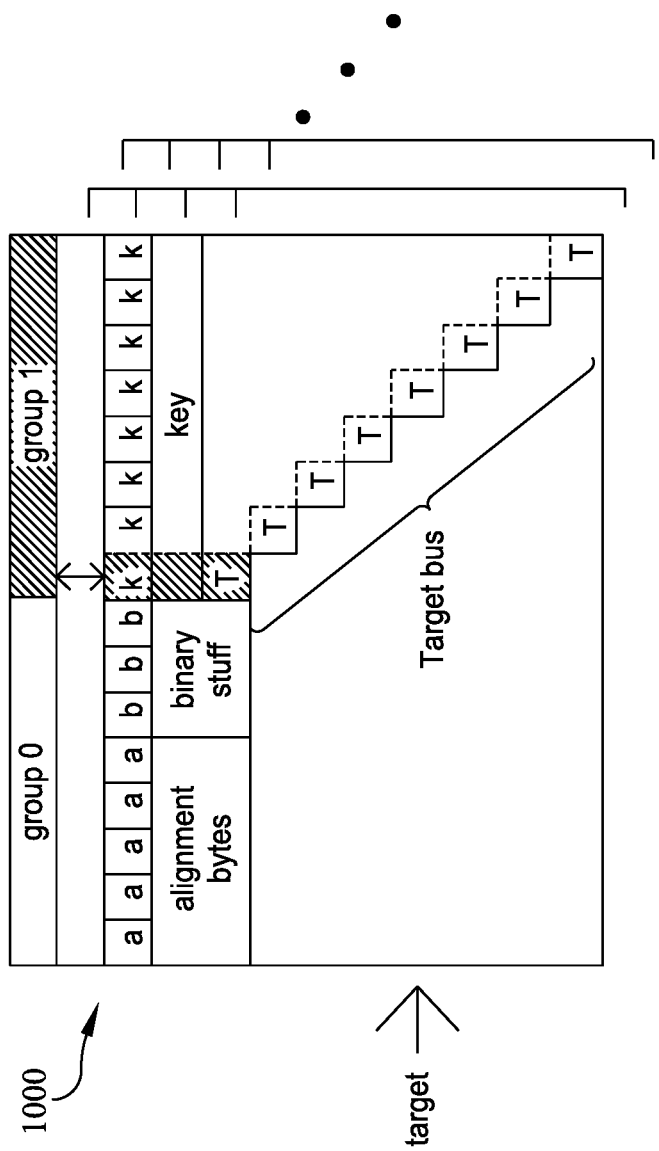
FIG. 10 illustrates alignment of a self-addressing memory indexbase item structure with self-addressing memory sequencer groups in a self-addressing memory sequencer array, according to some embodiments.

FIG. 10 illustrates alignment of a SAM indexbase item structure with SAM sequencer groups in SAM sequencer array 1000, according to some embodiments. That is, according to various embodiments, a cITEM is aligned with sequencer groups in a sequencer array. Hence, the key portion of a cITEM, beginning at the address of the cITEM, is aligned with the hardware sequencer groups. The configuration bits control whether the sequencer cell/group is active for key comparison or ignored for key comparison. In most cases the comparison is active for the key portion of a cITEM. However, there are situations when the binary part may also be subject to a scan.

Configuration bits also controls how a sequencer cell moves data to one of its neighbors. Where the binary part of the cITEM is three 64 bit words wide and the key part is two 64 bit word, the cITEM structure (a total of five 64 bit words) will be spread across five sequencer groups. The sequencer groups are connected to their immediate neighbors. A move across five sequencer groups pursuant to executing the insert phase of an OP_SCIN operation (scan and insert), or the like, is therefore held active for five clocks.

In some situations, an issue may arise where, in the middle of a row, where a cITEM spreads across the lower and upper sections of the row, so that mitosis cannot cleanly break off a half row or row-pair. This is, as noted above, referred to as "midcross," and like the insert task is resolved by special configuration bits. When an array of cITEMs would be spread across the lower and upper parts of a row/row-pair an extra few cycles result, to move the cITEM at the top end of the lower half to the bottom end of the upper half.

Each cITEM[ ] array is limited in size to a DRAM row/row-pair. Furthermore, the cITEM[ ] array may be partially filled. The unfilled space allows an insertion within the row/row-pair. In the majority of cases, this strategy obviates need for mitosis, at the expense of the extra space left unused in the array. In a worst-case, the storage efficiency of this allocation strategy is fifty percent, as discussed further below.

Consistent with the foregoing, the logic layer implements the sequencer(s) and the key extractor(s), marshals these keys to the sequencers, generates the sequencer opcodes, and accepts instructions from software to configure the sequencer. These parameters include key length, key location, key type, and configuration settings. These are conceptual extensions to the DDR-5 instruction set, or the like. This and other functions of the sequencer cell are discussed in greater detail below.

Returning attention to FIG. 6, the indexbase comprises a three-level tree of cITEM[ ]s. Each cITEM contains the address(es) of the lower level entity and a copy of the lowest key from that entity. This duplication enables the sequencer to scan a cITEM[ ] array for a target key in a single parallel operation without accessing the lower level. The three levels of the indexbase (cINDX, cPAGE, and cBOOK) are illustrated in FIG. 6.

Figure 6:
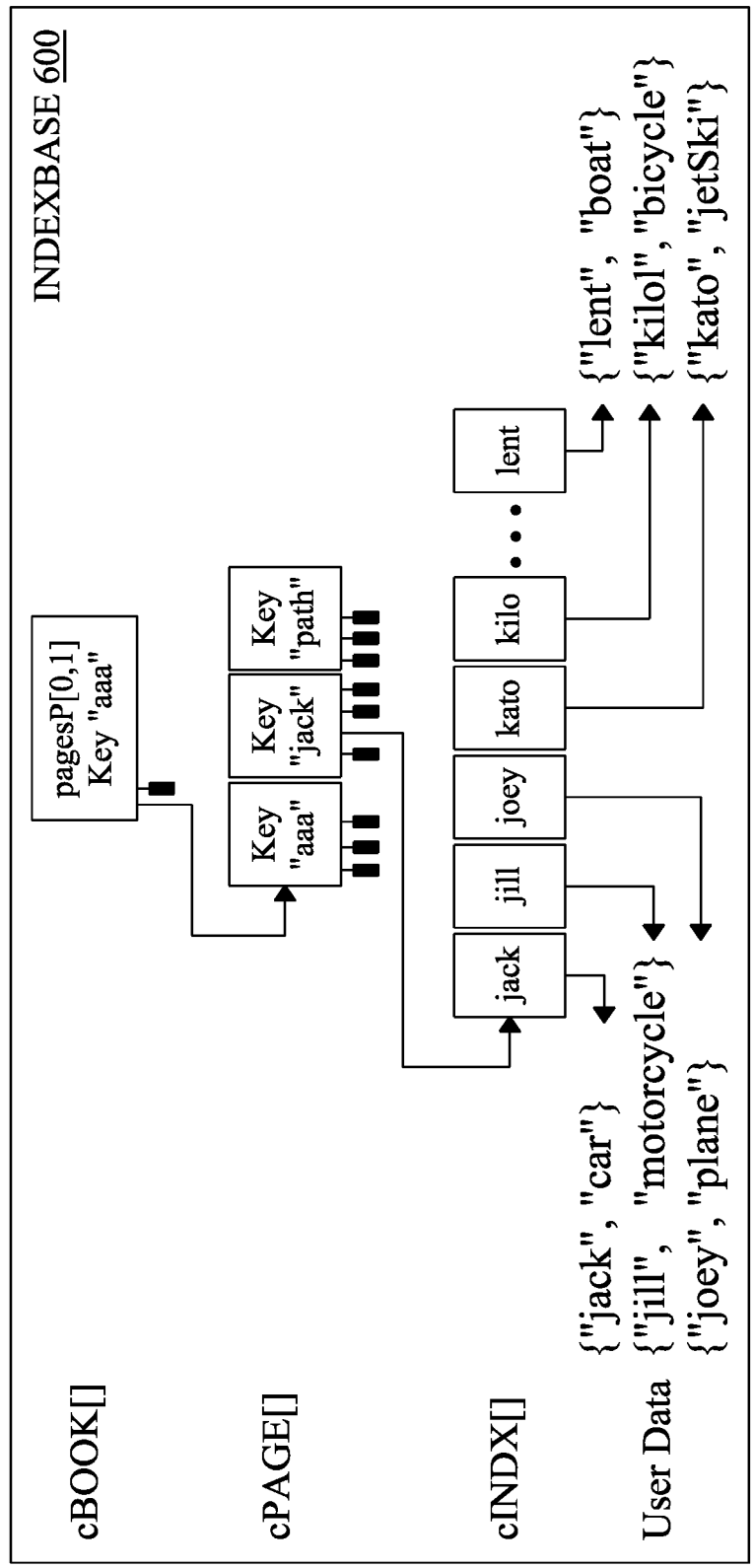
FIG. 6 is a block diagram illustrating components of a self-addressing memory indexbase, according to some embodiments.

The lowest level, as shown in FIG. 6, contains user-data. This user data is not part of the indexbase. The data is organized into records, such as {"jack," "car"}, where one of these fields, "jack," is the key field and the remainder are non-key fields such as "car." In accordance with various embodiments, there are three levels of index erected over this data. First, cINDXs contain the key of and the address of the user-data record (jack, jill, joey, kato, kilo . . . lent in FIG. 6.). The second layer cPAGEs, contain the addresses of one or two cINDX[ ]s and a copy of the cINDX[0] key. The third layer cBOOK contain one or two addresses of two cPAGE[ ] and copy of cPAGE[0] key.

All three structures are stored in SAM-cache, but they are paged to DRAM if necessary. The priority of retention in SAM-cache may be cBOOK>cPAGE>cINDX, cBOOK and cPAGE may have identical structures. The physical layout of the sequencers may be influenced by hardware but they are configured differently by software to support cINDX[ ], cPAGE[ ], or cBOOK[ ]s and keys of different sizes.

With reference to FIGS. 1 through 3, control lines emanating from a sequencer group control the operation of the sequencer cell. Therein, cmp-I receives compare results from the sequencer cell on the "left," cmp-O outputs the compare results to the sequencer cell on the "right," rcmp-O outputs group cmp-O results propagated back to the head of the sequencer group, rcmp-I receives the rcmp-O results. The target[63:56] is the target of the scan. The kreg[7:0] is the value stored by the sequencer cell. The prev-I[7:0] receives the value of kreg/DRAM from the sequencer cell on the "left" for an insertion operation. The next-0[7:0] provides the value of kreg to the sequencer cell on the "right." The konfig register is loaded by the software using OP_CFG. The DRAM-IO[n] and DRAM_IO[n+1] connect to DRAM. Cmp-I/O and rcmp-I/O, discussed above, are two-bit buses encoding the signals {equ, gtr} from the comparator. In an example, less-than is {0,0}, greater-than is {0,1}, equal-to is {1,0}, and not-used is {1,1}. Stop is set on the last valid sequencer group.

Sequencer cells are physically aggregated into sequencer groups, as discussed above. However, sequencer cells are logically aggregated into cITEMs. The logical geometry is controlled by software using the konfig register. The size of a cITEM is not fixed but varies according to the size of the cINDX, cPAGE, or cBOOK and the key. The size of the sequencer group may be fixed at design-time.

Once a sequencer cell determines that its kreg is larger than or smaller than, but not equal to, the byte on the target bus, then cmp-O prevails for all sequencer cells to its "right". When a sequencer cell determines that its kreg is equal to the byte on the target bus the decision on greater/less may be deferred to the sequencer cell on the "right".

Each cITEM transmits the value of their kreg on the next-0 connection to the prey-I of the cITEM on the "right". However, the receiving item may only load its kregs from prey-I when it is located beyond the insertion point and the opcode==OP_SCIN.

As discussed above, with respect to FIG. 3, sequencer cells are arrayed in diagonal sequencer groups across the DRAM sense lines. FIG. 3 illustrates two sequencer groups that each comprise four sequencer cells. M is the DRAM row connection. T is the target bus. Each C is an eight-bit sequencer cell. Each sequencer cell is connected to one byte of the DRAM row, which are the vertical connections, M[0], M[1], etc. Each sequencer cell is also connected to one byte of the target bus, which are the horizontal connections, T[0], T[1],etc. This connection drives the diagonal geometry of the sequencer cells on the die. The diagonal arrows between the sequencer cells show propagation of the results of the sequencer cell comparison.

The size of the diagonal sequencer group may be equal to the size of the target bus and may be determined at design-time. The size of the cITEM may be smaller, equal to, or larger than the size of the target bus.

The results of the compare are propagated from "left" to "right." The final result from the last sequencer cell in the cITEM is propagated back along the daisy chain from "right" to "left." The maximum latency is therefore two times the sum of sequencer cell latencies down the diagonal. For every sequencer group to the "left" of insertionPoint, the target kreg. For every sequencer group to the "right" of the insertion Point, target<kreg. The sequencer cell at the insertionPoint is characterized by having cmp-I==0 and cmp-O==1. Insertion at this point keeps the entire row in sorted order.

As discussed below in greater detail with respect to FIG. 10, each cITEM should be aligned with the target bus. This may call for alignment bytes in front of each cITEM. Alignment renders some sequencer cells unused when scanning some items. The DRAM row reflects the layout of cITEMs and includes these alignment bytes.

The behavior of the sequencer cell is controlled by two signals, the opcode and the configuration. The operation of each sequencer cell is controlled by opcodes generated by its parent sequencer group. One sequencer cell may respond differently to its neighbor with a given opcode because of its configuration. The configuration of a sequencer cell is specified in the sequencer cell config register, kconfig. The configuration of the sequencer group is specified with sequencer group configuration bits.

The number of cINDX[ ]s, cPAGE[ ]s, or cBOOK[ ]s that can be stored in a single DRAM row is limited by the size of that row. The addition of a new key to the indexbase will cause a new cINDX entry to be added to a cINDX[ ] array which may already be full. In the face of this imminent overflow, additional SRAM must be allocated for the additional data. The strategy for dealing with the situation is mitosis, per FIGS. 8A through 8C or 9A through 9C. The strategy applied at the cINDX layer may trigger an overflow at the cPAGE layer, which may, in turn, trigger an overflow at the book layer. Each of these layers use mitosis, per FIGS. 8A though 8C or per FIGS. 8A though 8C, to allocate more space.

In double row mitosis, cPAGE comprises a pair of cINDX[ ] arrays called loP and hiP, ABCJ and KLXY in arrays of FIGS. 8A through 8C, and cBOOK comprises a pair of cPAGE[ ] arrays rows called pageL and page H. These paired arrays are inter-connected to operate like a single array for most purposes. However, they operate as two separate arrays when mitosis is involved. Mitosis takes loP and hiP, or pageL and pageH, and pairs them with empty rows, then adjusts the pointers in the parent structure to reflect this new reality. Mitosis involves pointer shuffling, and does not move, add, or delete user data.

In single-row mitosis, cPAGE comprises a single cINDX[ ] array. When the array is mitosed, the "upper" half is written to a new row and adjustments are made to the cPAGE/cBOOKs "above" cINDX[ ]. The "upper" part of the cITEM[ ] array now occupies the "upper" half of the row ("right handed" row) and the "lower" part of the cITEM[ ] array occupies the original row ("left handed" row). The different handedness is recorded by a bit in the parent cPAGE/cBOOK. As illustrated in FIGS. 8A through 8C, mitosis leaves rows partially filled. Subsequent writes may fill up these partially filled rows, but in some situations, they will remain half full indefinitely. Under various embodiments, an indexbase will normally be about fifty percent full after all user records have been written. SADRAM can compact the indexbase, yielding back this space. In addition to saving space, compacting the indexbase means that every cINDX[ ], cPAGE[ ], or cBOOK[ ] array, except possibly the last, will have the same number of entries. This facilitates access-by-record number since the location of a cPAGE or cINDX can be calculated rather than accessed through a sequencer. Access-by-key is not simplified by compaction but does benefit from requiring fewer DRAM accesses to perform a given task.

The keys that populate the cINDX[ ], cPAGE[ ], and cBOOK[ ] are a large consumer of storage space. After the sort is complete this space can be discarded. This process is referred to as "stripping." The indexbase then collapses to an array of pointers to the user data. This array of pointers imposes a small overhead. In effect, access to records in sorted order is an indirect read. Access to a record from the sorted set involves retrieving the absolute address of the user record from the indexbase and then reading or writing the user record or fields thereof.

The savings afforded by stripping may come with penalties. First, the user data can no longer be accessed by key. Second, records cannot be added to the indexbase and still preserve sorted order. However, other benefits of the indexbase are not forfeited by stripping.

Compaction and stripping are software functions. In some implementations, compaction and stripping are implemented in the hardware. In accordance with various embodiments of SAM, the indexbase may be visible as ordinary DRAM to facilitate these functions.

As noted, FIG. 10 illustrates alignment of a SAM indexbase item structure with SAM sequencer groups in a SAM sequencer array, according to some embodiments. A cITEM comprises three separate field types. The first field is alignment bytes, denoted by "a" in FIG. 10. The second field is binary, denoted by "b" in FIG. 10. The third field is key, denoted by "k" in FIG. 10. FIG. 10 shows alignment of an cITEM with the sequencer groups in the sequencer array. As illustrated, cITEM.bin (the binary part of the cITEM) comprises 3 bytes (bbb). Consequently, five bytes of alignment (aaaaa) are inserted so that cITEM.key will align with a sequencer group. The location of cITEMs in the DRAM row should be adjusted so that key[0] aligns with target[0]. In FIG. 10, each T is a sequencer cell, cITEM groups are replicated across the DRAM row and the target is fed straight thru to each of these sequencer groups.

In FIG. 10, each sequencer group compares the target with each key from the DRAM row. The results can be summarized with a vector of ">>>==<<<<" where ">" means that the target is greater than cell.kreg, "=" means the target is equal to cell.kreg, and "<" means the target is less than kreg. Each comparison may be referred to as a "duck."

The ducks on the "left" should all be "facing right" (>), in other words, target is greater than kreg. The ducks in the middle should be "facing forward" (=), in other words, target equals kreg. The ducks on the "right" should all be "facing left" (<), in other words, target is less than kreg. Any of these groups may be empty. The insertion point is immediately to the "left" of the "<<<<" sequence (i.e., at the asterisk ">>>==*<<<<").

In accordance with various embodiments, sequencer has five data inputs. The first input is a 16-bit opcode generated by the SamPU. The opcode is passed straight thru the sequencer array, but the sequencer groups translate this opcode into a 5-bit controls bus which is passed on to each sequencer cell. Opcodes execute simultaneously in all sequencer cells/groups. The second input is "cellMask," which is the result of OP_SCAN and enables/disables each sequencer group. The third input is "DRAM row," which is raw data on which the sequencer acts. The fourth input is cmp-I which is a compare input from a neighbor to the "left", and the fifth is cmp-O. The configuration of a sequencer cell/group is loaded into each sequencer group/cell by OP_CFG (well) before any OP_SCAN, OP_SCIN, OP_READ or OP_WRYT is executed. These adapt the sequencer cell/group to the specific key size, item size, and alignment for the particular sort (or other operation) being performed.

Opcodes act in the temporal domain, configuration acts in the spatial domain. The sequencer cells change in response to opcodes and other conditions but may not be locked to sequencer cell location. By contrast, configuration applies to individual sequencer cells/groups but does not change over time. The cellMask fits in between, in that it varies with time but is wired directly to each sequencer group. This multi-domain control is used to match a fixed hardware architecture to variable software requirements.

The number of bytes in the key is specified by the user and is unknown at design-time. The location of each sequencer group relative to the key is known at run time. This is specified in konfig[1:0] for cI NDXs and konfig[3:2] for cPAGE/cBOOKs.

TABLE 1

The configuration word.

| Bits | Item | Value |
| --- | --- | --- |
| [1:0] | cINDX | CFG_IDLE=2'b00, CFG_1ST=2'b01, |
| [3:2] | cPAGE/cBOOK | CFG_MID=2'b10, or CFG_LAST=2'b11 |

In accordance with various embodiments, the vector of configuration words occupies an entire DRAM row. The two pairs of bits [1:0] and [3:2] apply to individual sequencer cells across the row. The configuration vector is written to DRAM and then OP_CFG causes each sequencer cell to load the DRAM byte into its kconfig register, and there it remains unchanged for succeeding opcodes. The same technique is used to load the sequencer group configuration word.

The SamPU opcodes are 16-bits wide as shown in FIG. 5. The action bits specify the action called for from the sequencer group or cell. Other fields specify registers or immediate values. The sequencer array is confronted with a row of cITEMs in sorted order and a target that should be compared with each of these cITEMs. One cITEM will have cmp-I==0 and cmp-O==1, namely the one at the insertion point. Inserting at this point keeps the entire row in sorted order.

The key in each cITEM should be aligned with the target bus. This may call for padding bytes in (a) cITEM(s). Padding renders some sequencers unused. Each DRAM row is aligned in the same manner.

When accessing the data after sort has completed, the record addresses are random. This randomness is intrinsic since the sorted order is dependent on the user-data. For any indexing algorithm, an input ordering can be contrived which will cause memory to thrash. However, once the indexes are created, the randomness is known in advance. This enables SAM to anticipate future requests and read the record into cache in advance of the user request. This does not alter the effort taken to access the user data but hides the time behind other computations.

In some instances, anticipating user accesses may be difficult to implement. In absence of other information, the effort to read user data in advance may slow down the overall performance. This reduction in performance may be because the DRAM row buffer functions as a kind of forward cache and provides these advantages at zero cost. SAM is subject to the same limitations. Sorted data does not enjoy this free "row buffer" advantage, but the indexbase provides insight into the location of user data and is more likely to successfully anticipate upcoming reads.

Each cINDX[ ] array contains a list of user-record addresses. This list is a list of the presumed upcoming addresses, and the cINDX containing the address will be in SAM-cache because it was used to locate record[n].

Keys may be larger or smaller than the target bus size. The primary measure of SAM's capacity is the size of the target bus. This governs the size of the key that can be processed "in one cycle" and the number of groups that can fit across a DRAM row.

Keys larger than the target bus are multiplexed through the sequencer(s). Keys smaller than the target bus may be packed so that two comparisons are done in a single cycle, referred to as "double stuffing." This may call for some variations in the configuration word and the opcode. Double stuffing may call for interleaving the keys, and other techniques.

SamPU Operation

In various embodiments the SamPU has an opcode size of 16-bits and data size of target-bus-sz (equal to 8 bytes (64-bits) in a Field Programmable Gate Array (FPGA) implementation). The SamPU has a five-bit status registers {s4:s0} in which s1=carry, s2=~carry, s3=zero, s4=~zero, and s0=qrdy (data ready in the input que). The opcodes for SamPU are shown in FIG. 5, with a brief explanation of the meaning of each. Table 2 below provides further description of the operation of the SamPU opcodes.

TABLE 2

Description of SamPU Opcodes

| | |
|---|---|
| OP_CALL | pushes down PC and jump to the relative address {a10:a0} |
| OP_READ | reads a word from the current row into the $breg |
| OP_WRYT | writes a word from the current row into the $beg |
| OP_SCAN | scan current row for the key in $0, $1,... |
| OP_SCIN | scan current row for the key in $0, $1,... and inserts into row. |
| OP_RDF | read the field specified by {f4:f0} at the address in $areg |
| OP_WRF | write the field specified by {f4:f0} at the address in $areg |
| OP_BUG | various debugging functions |
| OP_PRINT | output specified message number |
| OP_GO_T | jump to pc+reladr if status & {c4:c0} == {c4:c0} |
| OP_GO_F | jump to pc+reladr if status & {c4:c0} != {c4:c0} |
| OP_ARITH | various arithmetic functions (see Table 3) |
| OP_RI | load $regB with 8-bit literal, zero extended to full word |
| OP_REPEAT,OP_REPREG | repeat next opcode by literal or $reg |
| OP_CROWI, OP_CROW | set current row within SRAM from literal or $reg |
| OP_RET | return from OP_CALL or OP_COVLY |
| OP_CFG_C, OP_CFG_G | configure the sequencer group/cells from data in the current |
| OP_GOVLY, OP_COVLY | Goto and call address in overlay |
| OP_LDI | Left shift reg $0 and insert 14-bit literal |

The arithmetic functions of the opcode are encoded in the subOp field of OP_ARITH as shown in the arithmetic subcodes shown in Table 3, below.

TABLE 3

Arithmetic Subcodes

| | | | | | | | |
|---|---|---|---|---|---|---|---|
| 0x00 | ADD | 0x08 | XSUB | 0x10 | R2R | 0x18 | n/u |
| 0x01 | ADC | 0x09 | XSBB | 0x11 | XCHG | 0x19 | n/u |
| 0x02 | SUB | 0x0A | INC | 0x12 | XTOS | 0x1A | CMPS |
| 0x03 | SBB | 0x0B | DEC | 0x13 | POP | 0x1B | n/u |
| 0x04 | CMP | 0x0C | SHL | 0x14 | PUSH | 0x1C | STC |
| 0x05 | XOR | 0x0D | SHR | 0x15 | $crow=lit | 0x1D | CLC |
| 0x06 | OR | 0x0E | RCL | 0x16 | n/u | 0x1E | STZ |
| 0x07 | AND | 0x0F | RCR | 0x17 | n/u | 0x1F | CLZ |

Applications of Sadram

There are many applications of SADRAM. For example, applications include sort, database functions, and variable length records. These applications exploit the sequencers to accelerate performance. Further applications include sparse array storage, integer division, record packing, file directory management, search algorithms, numerical accuracy control, string pool management, and a large set of commercial algorithms.

Sort is an algorithm that consumes a large percentage of computer resources. In a typical data center as much as twenty-five percent of computer power is used for sort and in some installations that may be as high as fifty percent. Some algorithms, such as databases, may not use sort overtly but still exploit sorted structures. Sort is one application of SAM. The indexing is carried out as the data is written to memory. Once writing is complete, the data can be accessed in sorted order. In some embodiments, indexing is overlapped with writing so that no additional time is required. Conceptually, sort is writing with a direct addressing protocol and reading back with a symbolic addressing protocol.

Merge is part of the sort process but it can also be used without reference to sort. Sort is performed on chunks of data that can fit within the SRAM on the logic layer. When the entire user data file has been sorted into chunks, the chunks are merged. The merge is insertion of indexes (keys) from one chunk into the output stream, thus, in accordance with embodiments of SAM, no mitosis is required. The sequencer performs the operation of inserting the input record into the output stream.

Databases are implicit users of sort. A database is organized so that any record can be quickly retrieved without resorting to a breadth-first search. This implies that the data is ordered according to some principle, and that principle is most often sort. A database comprises user data together with indexes into that data and software services to access this data. Databases permit record deletion and record replacement. Indexes are adjusted in light of these deletions and changes. These features differentiate databases from sort. However, the central feature is the same, embodiments of SADRAM implements database functions at the hardware level without multiple memory access that would be required for CPU "address computations."

The most prevalent instance of variable length data is the character string. A character string containing a client name will have significantly different length for each instance of the address. A common technique for handling variable length strings exploit garbage-collection. Garbage-collection employs a sort to separate valid, versus invalid, data references. However, SADRAM can do significantly more than merely replace sort. SADRAM can maintain fundamental data pointers as they are generated, in accordance herewith, so that the sort is already done when garbage-collection is called for. The SADRAM move operations can then be used to perform the data compaction in the second step of garbage-collection.

Sparse arrays, in which only a small fraction of the theoretical addresses map to valid data values, are also good candidates for SADRAM optimization. By addressing sparse arrays symbolically, rather than absolutely, the unused zero locations are not represented and do not occupy DRAM space.

Integer division by a fixed divisor is another application of the SADRAM sequencer. The sequencer is loaded with various break points and a lookup matches these breakpoints with a divisor. The breakpoint is then subtracted from the dividend and the process is repeated with a smaller value for the dividend. This is called linear refinement. Linear refinement is more efficient than performing division one bit at a time and can be extended to other mathematical functions for which linear refinement can be applied.

SADRAM is, in accordance with various embodiments, compatible with DRAM. However, for functions which involve sequencers and potentially multiple levels of sequencers, the rigid service time specified for DRAM may not be supported. SADRAM has a ready line which signals when data is available to the CPU. Other minor differences include, SADRAM making use of additional DDR-5 instructions, or the like, to specify setup information such as the position, length, and type of key fields, and include SADRAM appointing certain address to trigger index creation.

Sort

Sort is an application of the SAM architecture. User data may be organized into records and SAM expects each record to have one contiguous key. The record may have other non-key fields. The key field defines the expected order of the sorted data. SAM uses a key sort algorithm in which the user data remains in place, and a sorted index is created pointing to the user data.

Except for the key, the structure of the user record is opaque to SADRAM. The offset, size, and byte order of the key field should be declared when the sort is initiated and may not be changed thereafter. Byte order means whether the key field is in MSB first order or LSB first order. As noted, alphabetic fields are naturally in MSB first order, and binary fields may be in MSB order or LSB order.

SAM may not make use of sort compare functions, for example, as used in "qsort." Comparisons are carried out in hardware and may not be visible to the software. However, a private class can be derived from the "cSadram" class in which the key is constructed from diverse parts of the record. This enables non-standard or fractionated keys to be used. Non-standard or fractionated keys may also be implemented by encapsulating the record in a larger structure containing a compliant key.

After data records have been sorted, user-data can be retrieved using the original record number, for example, conventional memory addressing, the sorted record number, and/or a key, assuming the key is not stripped from the index.

User data is the payload. Indexing storage is overhead. Efforts to minimize the size of the key will lower sort times and reduce storage overhead. The data fields, other than the key fields, can be changed after sort.

The indexbase can be constructed in a variety of ways. A first method is as a side effect of writing a record. This method may be more efficient than other methods. As the data is written to memory, either by the CPU or from another hardware device, the key is extracted from the user data as it is written to DRAM. The key is incorporated into the index. This presumes that the record is fixed in length or adheres to the SAM convention for variable length records. For example, the first 16-bit word is the total record length in MSB order. This method involves writing the data to memory, then reading it back in sorted order.

A second method is as a side effect of reading the record. This is related to the first method, however, the datafile should be read in its entirety, which may not be operationally convenient. This method has minimal burden on the application because merely reading through the datafile sorts the file.

A third method is by calling the WriteIndex (uint8_t *keyP) explicitly. With this method, the software isolates and prepares the key, then calls WriteIndex to insert the key into the indexbase. This approach can be used when the underlying data does not reside in DRAM but has a unique address in some other media, or is virtual.

Various steps may be involved in these methods. For the first two methods, and in step zero, SAM examines the record as it is read/written to DRAM and extracts the key from the designated location in the record. For each method, and in step one, SAM scans the cBOOK[ ] array to find the lowest cBOOK for which cBOOK.loKey is less than the extracted key. This locates the cPAGE[ ] on which the key belongs. For each method, and in step two, SAM scans the cPAGE[ ] from the step one for the lowest cPAGE for which cPAGE.loKey is less than the extracted key. This locates the cINDX[ ] on which the key belongs. For each method, and in step three, SAM scans the cINDX[ ] from step three for the lowest cINDX for which cINDX.loKey is less than the extracted key. This locates the cINDX for the key or the position at which to insert the key. For each method, and in step four, SAM inserts the key into the cINDX[ ] and moves all records with a larger key to a higher location within cINDX[ ].

Step four may overflow the cINDX[ ] array, which may be addressed using mitosis to accommodate the new entry. This may cascade to the cPAGE[ ] and cBOOK[ ], which may also be addressed using mitosis to accommodate the new cPAGE or new cBOOK. In some implementations, each cITEM resides in the cache memory built into the logic layer "on top of" the DRAM and these operations can be expected to proceed. If either of the first two methods of building the index is employed, then the time taken to read or write the data can reasonably be expected to be longer than the time taken to create the index. In this situation, the time taken to create the index appears to be zero to the user. However, should the cPAGE or cINDX not be present in cache, then it must be obtained by accessing DRAM. This action may compete for bandwidth with the read/write operation itself. Even in this case, the read of the appropriate row of cPAGE or cINDX data is directed, and does not involve scanning through DRAM.

The first additional method is doing nothing. The indexbase is left in its final state, and the cINDX[ ], cPAGE[ ], and cBOOK[ ] arrays may be partially filled, which leaves the indexbase amenable to subsequent additions. This is the state most frequently selected. This partially filled scenario may provide arrays being left deliberately part filled, so that data can be added without moving data.

The second additional method involves compacting the indexbase. The indexing structure can be compacted to minimize the space overhead of the indexbase. This leaves the indexbase amenable to reads and/or writes by key and further additions, but with minimal space overhead. Any addition may invoke mitosis for the cINDX[ ], cPAGE[ ], or cBOOK[ ], to accommodate the new key.

The third additional method involves stripping the indexbase. The indexbase can be stripped of keys and indexing overhead and can be reduced to an address. This reduces the space overhead to about 1.5% of the space required by the user data, given reasonable record size and key size assumptions, but leaves the indexbase unable to insert new keys. Access to the sorted data involves reading the index for the redirected address, then reading the data record itself. As long as the indexing structures remain in SAM-cache, this imposes little access overhead.

The additional methods of compacting and stripping allow record retrieval by calculation since the cINDX[ ] are uniform in size and the redirected address can be computed directly from a, possibly sorted, user supplied record number. In either case the record number being requested should be divided by the number of cINDX or redirected addresses present in each row. For method three, and assuming the redirected address is eight bytes or some other power of two, then this involves division in a shift operation. For additional method two, the division is not a power of two and another division process should be employed, as discussed below.

For additional method one, in which the cBOOK, cPAGE, and cINDX entries have a variable number of entries, the full power of a sequencer may be called for. When reading in sorted order, a total field in the cPAGE/cBOOK structure is scanned by the sequencer to locate the proper record. To this end, the cPAGE/cBOOK structures have a "total" field that contains the number of records in this and all preceding pages.

Because there is one cINDX per user record, this is equivalent to saying that the total field is the number of records in this and all preceding pages. The cBOOK structure also contains a "total" field that records total information one level above cPAGE. This "total" field is stored in MSB order to enable a sequencer to scan the items with the compare technology. When the user accesses the user-data in sorted order, the "sorted record number" acts like a key. The same three method procedure is employed to locate the user record as is used to locate a record by key.

SAM-sort as described above is a bubble sort. By some measures, this is an process. Because SAM-sort does the comparison one sequencer group at a time, the order of magnitude is O(n2/(2*groupCount)), where groupCount is the number of sequencer groups per sequencer array.

Sort-merge employs O(n.log 2(n)) steps. SAM uses sort-merge when the number of cINDXs justifies this strategy. The switch occurs when the cache memory becomes filled with cBOOK[ ], cPAGE[ ], and cINDX[ ]s. The entire indexbase is then flushed to DRAM. The cache is cleared. Sort proceeds ab-initio. When all, or nearly all, records have been thus processed, the set of cached images are merged to create the final sort. The compare and shift functions of the sequencers are pressed into service for this merge step.

In accordance with various embodiments, the data elements most involved in the merge are the cINDXs. The cBOOK[ ] and cPAGE[ ] arrays, to locate the relevant cINDX[ ] arrays. The cINDXs are merged from two streams at a time and packed as they are written from the merge process. The merging process is repeated recursively until the set of cached images merge to a single sorted array.

Database Functions

Hardware based lookup, referred to as sequencers, enable a range of functions to be performed in various ways such as database functions, division, and super-packing.

Databases are similar to sort in many ways and might be thought of as an "incomplete sort" because the index(es) developed for the sort are not discarded at the end of the sort, but are retained to facilitate further indexbase operations. Databases may have multiple keys, and therefore multiple indexbases, and provide record deletion and replacement. Databases may employ key-only indexes, which may involve records with only a key field. All these functions can be construed as sequencer operations.

Sequencers can be used to manage the indexes whether the data addressed by the cINDX structure refers to DRAM or some secondary storage media. Databases contained in DRAM are useful because they may be faster than bulk storage media such as disk or flash RAM. Development of non-volatile DRAM may make in-RAM databases more useful.

Nevertheless, DRAM is likely to remain more expensive than bulk storage for the foreseeable future. It may be beneficial to squeeze as much data into DRAM as possible. SAM's support for variable length records is a tool to reduce the footprint of a database. Despite the support for variable length records, the key(s) of these records must be fixed length or at least less than a predefined maximum key size.

The sequencer protocol for multi-key is similar to that of a single key. In either case, a goal is to overlap index creation with the write or read of each record. In some implementations, there would be enough sequencer to perform these tasks simultaneously, but this may rarely be true in practice. Accordingly, the keys may be serially multiplexed through the available sequencer(s).

Different user requirements may require different configuration settings. For example, if the first user key was eight bytes long and the second user key was sixteen bytes, the sequencer would need to handle (i) cITEM sizes of 8+cITEM.bin and 16+cITEM.bin. To perform this service, each sequencer cell and each sequencer group keeps configuration settings for all four contingencies so that the sequencer cell/group can switch between different cITEMs and key combinations. Support for multi-key percolates down through the architecture but does not change SAM methodologies.

To support multiple simultaneous keys, the configuration word may be increased to provide 4 bits of configuration information for each key. OP_CFG is referred to multiple times to accumulate the total number of bits for all keys written. The rowType field in the OP_SCAN and OP_SCIN opcodes (see FIG. 5) is increased to select from this larger set of configuration bits.

Variable Length Records

Variable length records are a way to wring the most from DRAM, especially for in-RAM databases. Few modern languages have adequate facilities to handle variable sized structures. Consequently, enormous amounts of DRAM and secondary storage is wasted storing zeroes, or spaces, to pad intrinsically variable length entities. SAM supports variable length records without resorting to such wasteful techniques.

In traditional array processing, the address of any element is computed using address=base+recordSize*record Number, where base and recordSize are fixed. The computed address is then subject to virtual addressing mapping and thereby becomes essentially a random address in DRAM. SAM eliminates the above computation and performs the mapping function in memory. SAM treats the recordNumber (0, 1, 2, 3, . . . ) as a key field and accesses the data by way of this key. Retrieving data by recordNumber may not depend upon the record being fixed length. SAM frees addressing from linearity. A SAM convention is that the first two bytes, in MSB order, of the record are the total length of the record.

Other Sequencer Functions

Under embodiments of SAM, some arithmetic functions can be implemented using a lookup protocol realized by a sequencer. Multiply and divide are instances of such functions. In an example algorithm for division of a sixteen-bit number, for example one hundred seventy-one (171). The first lines of the algorithm may be a sequencer, which is a scan, executed in hardware. Later lines may build a sequencer table. Remaining lines may exercise a division algorithm and verify the results. The sequencer in this context is divorced from a DRAM connection and the lookup values are embedded in the sequencer. A table tbl[ ] is built into the logic itself. SAM uses a divide when the number of cITEMs on a row is not divisible by a power of two. Multiply follows a strategy similar to divide.

With ten binary digits the values from {0, 1023} can be presented. With three decimal digits the values from {0, 999} can be represented. The values 1023 and 999 are close enough to draw the conclusion that ten can be represented using 3⅓ bits. This finds expression that the number of bits to represent 10n is approximately n*(3⅓). The more accurate value may be log 2(10)=3.3219. For example, the value 109 would require 9*3⅓==30 binary digits or 32 bits can represent 4*109. Radix ten values may be represented with a four-bit BCD encoding. The super packed representation under embodiments of SAM constitutes a fifteen percent improvement in storage efficiency.

The encoding of a decimal number 1234=(((1*10+2)*10+3)*10+4 involves multiplication. Decoding calls for modulo 10 division. The same principle can be used with a different radix. For example, five requires 2⅓ digits which is a twenty-two percent savings over an octal representation, 1234=(((1*5+2)*5+3)*5+4). There are applications for mixed radix representations such as 1234=(((1*5+2)*6+3)*7+4. In some implementations, this would be computationally expensive. However, sequencers can be used in embodiments of SAM to perform this encoding and decoding efficiently.

It should be understood that various operations described herein may be implemented in software executed by processing circuitry, hardware, or a combination thereof (i.e., the DRAM logic layer discussed above). The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

To implement various operations described herein, computer program code (i.e., instructions for carrying out these operations) may be written in any combination of one or more programming languages, including an object-oriented programming language such as Java, Smalltalk, Python, C++, or the like, conventional procedural programming languages, such as the "C" programming language or similar programming languages, or any of machine learning software. For example, embodiments of the present SADRAM functionality may be accessed using a C++ class called cSadram. This class is the fundamental structure used by SADRAM utilities programs.

These program instructions may also be stored in a computer readable storage medium that can direct a computer system, other programmable data processing apparatus, controller, SamPU, or other device to operate in a particular manner, such that the instructions stored in the computer readable medium produce an article of manufacture including instructions which implement the operations specified in the block diagram block or blocks. The program instructions may also be loaded onto a computer, other programmable data processing apparatus, controller, or other device to cause a series of operations to be performed on the computer, or other programmable apparatus or devices, to produce a computer implemented process such that the instructions upon execution provide processes for implementing the operations specified in the block diagram block or blocks.

Reference is made herein to "configuring" a device or a device "configured to" perform some operation(s). It should be understood that this may include selecting predefined logic blocks and logically associating them. It may also include programming computer software-based logic of a retrofit control device, wiring discrete hardware components, or a combination of thereof. Such configured devices are physically designed to perform the specified operation(s).

The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory code," "tangible memory," or the like, are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although a few implementations have been described in detail above, other modifications are possible. In addition, the logic flows depicted in the figures do not require the particular order shown, or sequential order, to achieve desirable results. In addition, other actions may be provided, or actions may be eliminated, from the described flows, and other components may be added to, or removed from, the described systems. Accordingly, other implementations are within the scope of the following claims.

Although the above embodiments have been described in language that is specific to a memory device it is to be understood that the technology defined in the appended claims is not necessarily limited to memory devices only. In particular the methods and technique can be applied to the internal cache of a CPU Other devices are within the scope of the following claims.

Although the above embodiments have been described in language that is specific to certain structures, elements, compositions, and methodological steps, it is to be understood that the technology defined in the appended claims is not necessarily limited to the specific structures, elements, compositions and/or steps described. Rather, the specific aspects and steps are described as forms of implementing the claimed technology. Since many embodiments of the technology can be practiced without departing from the spirit and scope of the invention, the invention resides in the claims hereinafter appended.

What is claimed is:

1. A Self-Addressing Dynamic Random Access Memory (SADRAM) comprising:
   Dynamic Random Access Memory (DRAM); and
   a logic layer having direct access to the DRAM, the logic layer defining a sequencer configured to:
      maintain a DRAM row or DRAM row-pair in sorted order;
      find a location within the DRAM row or DRAM row-pair for a new data set element; and
      insert the new data set element into the DRAM row or DRAM row-pair, while preserving the sorted order.

2. The SADRAM of claim 1, wherein the sequencer comprises a plurality of sequencer cells, each sequencer cell operatively connected to a portion of the DRAM row or DRAM row-pair and operatively connected to a portion of an input target bus, and comprising:
  a data register; and
  one or more logic circuits configured to:
    compare data of a target byte against data of a byte in the DRAM; and
    determine, based on a resulting comparison of the data of the target byte against the byte in the DRAM, whether to:
      store the data of the target byte in the data register;
      store the data of the byte in the DRAM in the data register;
      shift the data register to an adjacent sequencer cell; or
      write the data register to the DRAM.

3. The SADRAM of claim 2, wherein the sequencer comprises a plurality sequencer groups, each sequencer group comprising one of the plurality of sequencer cells and configured to:
  manage a data word comprising a plurality of the target bytes or a plurality of the bytes in the DRAM, each byte of the data word assigned to one sequencer cell; and
  control the determination based on the resulting comparison of the data of the target byte against the byte in the DRAM.

4. The SADRAM of claim 3, wherein the sequencer comprises a sequencer array comprising the plurality of sequencer groups, the sequencer array configured to:
  manage one or more DRAM rows; and
  issue operating instructions to each sequencer group.

5. The SADRAM of claim 4, wherein each sequencer group interprets the operating instructions from the sequencer array to and/or for the sequencer group one plurality of sequencer cells.

6. The SADRAM of claim 4 wherein the logic circuits are further configured to:
  determine to take no action, in response to a determination that the data of the target byte is less than the byte in the DRAM;
  determine to write the data register to the DRAM, in response to a determination that the data of the target byte is greater than the register data; and
  determine to shift the data register to an adjacent sequencer cell, in response to a determination that the data of the target byte is equal to the register data.

7. The SADRAM of claim 4 wherein the logic layer defines a Self-Addressing Memory Central Processing Unit (SamPU) operatively coupled to the sequencer and configured to control the sequencer array.

8. The SADRAM of claim 1 wherein the logic layer further defines a memory cache, and the sequencer is further configured to implement symbolic addresses with reference to an index database created in the memory cache.

9. The SADRAM of claim 8, wherein the sequencer is further configured to mitose the index database in response to overflow of the index database by switching one row of each row-pair with empty rows to create two half full row-pairs using pointer shifting.

10. The SADRAM of claim 9, wherein the sequencer is further configured to hold a pipeline move one or more clock cycles to avoid an index database structure smearing across a midpoint of a row of the row-pair or the row-pair.

11. The SADRAM of claim 10, wherein holding the pipeline move one or more clock cycles migrates an index database structure from a lower half full row to an upper half full row.

12. The SADRAM of claim 8 wherein the sequencer is further configured to mitose the index database in response to overflow of the index database by assigning an original row and writing half of this row to a new empty row, creating two half-filled rows.

13. The SADRAM of claim 12, wherein the sequencer is further configured to hold a pipeline move one or more clock cycles to avoid an index database structure smearing across a midpoint between the original row and the new row.

14. The SADRAM of claim 13, wherein holding the pipeline move one or more clock cycles migrates an index database structure from the new row to the original row.

15. The SADRAM of claim 1, wherein the logic layer further defines a memory cache, and the sequencer is further configured to:
  implement symbolic addresses with reference to an index database created in the memory cache;
  flush the index database to the DRAM in response to the index database becoming filled;
  clear the memory cache;
  re-sort the indexbase in the memory cache; and
  merge the indexbase.

16. The SADRAM of claim 1 wherein the logic layer is configured to map DRAM data set elements in the logic layer by treating each data set element record number as a key field and retrieving data set elements by record numbers.

17. The SADRAM of claim 1 wherein the sequencer is further configured to support a plurality of index databases to support an in-RAM database with multiple indexes.

18. The SADRAM of claim 1 wherein the logic layer further defines a memory cache, and the sequencer is further configured to:
  implement symbolic addresses with reference to an index database created in the memory cache;
  maintain the index database as it is generated, maintaining and preserving the sorted order prior to garbage-collection; and
  perform data compaction using a move operation.

19. The SADRAM of claim 1 wherein the logic layer defines a SamPU operatively coupled to the sequencer and configured to control the sequencer and configured to load an overlay in response to a go overlay operational code containing an overlay number of the invoked overlay and an address within the overlay and transfer control of the sequencer to the address within the overlay.

20. A method for self-addressing Dynamic Random Access Memory (DRAM) comprising:
  maintaining, by a sequencer defined in a logic layer having direct access to DRAM, a DRAM row or DRAM row-pair in sorted order;
  finding, by the sequencer, a location within the DRAM row or DRAM row-pair for a new data set element; and
  inserting the new data set element into the DRAM row or DRAM row-pair, by the sequencer, while preserving the sorted order, by the sequencer.

21. A non-transient operational code stored in a logic layer having direct access to Dynamic Random Access Memory (DRAM), which upon execution by a Self-Addressing Memory Central Processing Unit (SamPU) causes the SamPU to:
  control a sequencer defined in the logic layer to:
    maintain a DRAM row or DRAM row-pair in sorted order;

find a location within the DRAM row or DRAM row-pair for a new data set element; and insert the new data set element into the DRAM row or DRAM row-pair, while preserving the sorted order.

* * * * *